(12) United States Patent
Henke

(10) Patent No.: US 10,964,492 B2
(45) Date of Patent: Mar. 30, 2021

(54) ARC SUPPRESSOR, SYSTEM, AND METHOD

(71) Applicant: Arc Suppression Technologies, Bloomington, MN (US)

(72) Inventor: Reinhold Henke, Alexandria, MN (US)

(73) Assignee: Arc Suppression Technologies, Bloomington, MN (US)

( * ) Notice: Subject to any disclaimer, the term of this patent is extended or adjusted under 35 U.S.C. 154(b) by 0 days.

(21) Appl. No.: 16/740,870

(22) Filed: Jan. 13, 2020

(65) Prior Publication Data

US 2020/0152400 A1 May 14, 2020

Related U.S. Application Data

(63) Continuation of application No. 15/840,608, filed on Dec. 13, 2017, now Pat. No. 10,566,150, which is a continuation of application No. 15/243,257, filed on Aug. 22, 2016, now Pat. No. 9,847,185, which is a continuation of application No. 14/039,889, filed on Sep. 27, 2013, now Pat. No. 9,423,442.

(60) Provisional application No. 61/788,786, filed on Mar. 15, 2013, provisional application No. 61/707,373, filed on Sep. 28, 2012.

(51) Int. Cl.
| | | |
|---|---|---|
| *H01H 9/54* | (2006.01) | |
| *H01H 33/04* | (2006.01) | |
| *H01H 33/12* | (2006.01) | |
| *H01H 71/04* | (2006.01) | |
| *G01R 31/50* | (2020.01) | |

(52) U.S. Cl.
CPC .............. *H01H 9/54* (2013.01); *G01R 31/50* (2020.01); *H01H 9/542* (2013.01); *H01H 33/04* (2013.01); *H01H 33/121* (2013.01); *H01H 2071/048* (2013.01)

(58) Field of Classification Search
CPC .......... H01H 9/54; H01H 9/541; H01H 9/542; H01H 2009/545; H01H 33/04; H01H 33/121; H01H 33/596; H01H 1/0237; H01H 1/02372; H01H 2071/048; G01R 31/02; G01R 31/50
USPC ................ 218/8, 6, 2, 18; 361/2, 8, 13, 42; 335/57, 201
See application file for complete search history.

(56) References Cited

U.S. PATENT DOCUMENTS

| | | |
|---|---|---|
| 3,372,303 A | 3/1968 | Knott |
| 3,805,200 A | 4/1974 | Suzuki |
| 4,251,845 A | 2/1981 | Hancock |

(Continued)

FOREIGN PATENT DOCUMENTS

| | | |
|---|---|---|
| WO | WO-2014052810 A1 | 4/2014 |
| WO | WO-2014052872 A1 | 4/2014 |

OTHER PUBLICATIONS

U.S. Appl. No. 14/039,889, U.S. Pat. No. 9,423,442, filed Sep. 27, 2013, Arc Suppressor, System, and Method.

(Continued)

*Primary Examiner* — William A Bolton
(74) *Attorney, Agent, or Firm* — Schwegman Lundberg & Woessner, P.A.

(57) ABSTRACT

Device, circuit, system, and method for arc suppression. A contact separation detector is configured to output an indication of a separation state of a pair of electrical contacts. A contact bypass circuit, coupled to the contact separation detector, is configured to provide an electrical bypass between the pair of contacts based on the indication.

20 Claims, 14 Drawing Sheets

(56) References Cited

U.S. PATENT DOCUMENTS

| | | | |
|---|---|---|---|
| 4,393,287 A | 7/1983 | Nakano | |
| 4,658,320 A | 4/1987 | Hongel | |
| 4,745,511 A | 5/1988 | Kugelman et al. | |
| 5,402,297 A | 3/1995 | Ouchi et al. | |
| 5,452,170 A * | 9/1995 | Ohde | H01H 33/596 174/DIG. 17 |
| 5,548,461 A | 8/1996 | James | |
| 5,682,101 A | 10/1997 | Brooks et al. | |
| 5,699,218 A | 12/1997 | Kadah | |
| 5,703,743 A | 12/1997 | Lee | |
| 6,046,899 A * | 4/2000 | Dougherty | H01H 9/542 361/104 |
| 6,621,668 B1 | 9/2003 | Sare | |
| 6,956,725 B2 | 10/2005 | Boughton, Jr. et al. | |
| 7,538,990 B2 | 5/2009 | Belisle et al. | |
| 7,763,874 B2 * | 7/2010 | Noguchi | H01H 9/161 250/551 |
| 7,817,382 B2 | 10/2010 | Yu et al. | |
| 7,876,538 B2 * | 1/2011 | Wright | H01H 59/0009 361/2 |
| 7,911,304 B2 | 3/2011 | Yano et al. | |
| 8,248,738 B2 * | 8/2012 | Roessler | H01H 9/542 361/8 |
| 9,423,442 B2 | 8/2016 | Henke | |
| 9,847,185 B2 | 12/2017 | Henke | |
| 10,566,150 B2 | 2/2020 | Henke | |
| 2002/0039268 A1 | 4/2002 | Bryan et al. | |
| 2002/0171983 A1 | 11/2002 | Brooks, Jr. | |
| 2004/0052011 A1 | 3/2004 | King et al. | |
| 2004/0052102 A1 | 3/2004 | Noda et al. | |
| 2004/0165322 A1 | 8/2004 | Crawford et al. | |
| 2007/0046233 A1 | 3/2007 | Kobielski | |
| 2007/0139829 A1 | 7/2007 | Arthur et al. | |
| 2008/0192389 A1 | 8/2008 | Muench et al. | |
| 2009/0168273 A1 | 7/2009 | Yu et al. | |
| 2011/0122538 A1 | 5/2011 | Maier | |
| 2011/0222191 A1 | 9/2011 | Henke | |
| 2014/0091059 A1 | 4/2014 | Henke | |
| 2014/0091060 A1 | 4/2014 | Henke | |
| 2014/0091061 A1 | 4/2014 | Henke | |
| 2014/0091808 A1 | 4/2014 | Henke | |
| 2016/0358721 A1 | 12/2016 | Henke | |
| 2018/0247776 A1 | 8/2018 | Henke | |

OTHER PUBLICATIONS

U.S. Appl. No. 14/039,958, filed Sep. 27, 2013, Contact Separation Detector and Methods Therefor.
U.S. Appl. No. 14/040,094, filed Sep. 27, 2013, Arc Suppression Control and Methods Therefor.
U.S. Appl. No. 15/243,257, U.S. Pat. No. 9,847,185 filed Aug. 22, 2016, Arc Suppressor, System, and Method.
U.S. Appl. No. 15/840,608, filed Dec. 13, 2017, Arc Suppressor, System, and Method.
U.S. Appl. No. 14/040,144, filed Sep. 27, 2013, Arc Suppression System and Method.
Engineers relay handbook, 3rd ed. National Association of Relay Manufacturers., NARM, (1980), 362 pgs.
"U.S. Appl. No. 14/039,889, Examiner Interview Summary dated Aug. 13, 2015", 3 pgs.
"U.S. Appl. No. 14/039,889, Non Final Office Action dated Apr. 7, 2015", 14 pgs.
"U.S. Appl. No. 14/039,889, Notice of Allowance dated Jan. 5, 2016", 11 pgs.
"U.S. Appl. No. 14/039,889, Notice of Allowance dated Jul. 1, 2016", 8 pgs.
"U.S. Appl. No. 14/039,889, Preliminary Amendment dated May 9, 2014", 6 pgs.
"U.S. Appl. No. 14/039,889, Response filed Oct. 6, 2015 to Non-Final Office Action dated Apr. 7, 2015", 9pgs.
"U.S. Appl. No. 14/039,958, Non Final Office Action dated Mar. 4, 2016", 8 pgs.
"U.S. Appl. No. 14/039,958, Preliminary Amendment dated May 9, 2014", 7 pgs.
"U.S. Appl. No. 14/039,958, Response filed Feb. 4, 2016 to Restriction Requirement dated Aug. 5, 2015", 9 pgs.
"U.S. Appl. No. 14/039,958, Restriction Requirement dated Aug. 5, 2015", 6 pgs.
"U.S. Appl. No. 14/040,094, Non Final Office Action dated Sep. 2, 2015", 8 pgs.
"U.S. Appl. No. 14/040,094, Preliminary Amendment dated May 9, 2014", 5 pgs.
"U.S. Appl. No. 14/040,144, Examiner Interview Summary dated Mar. 4, 2015", 3 pgs.
"U.S. Appl. No. 14/040,144, Non Final Office Action dated Dec. 19, 2014", 10 pgs.
"U.S. Appl. No. 14/040,144, Preliminary Amendment dated May 9, 2014", 5 pgs.
"U.S. Appl. No. 15/243,257, Non Final Office Action dated Dec. 8, 2016", 5 pgs.
"U.S. Appl. No. 15/243,257, Notice of Allowance dated Aug. 9, 2017", 9 pgs.
"U.S. Appl. No. 15/243,257, Response filed May 8, 2017 to Non Final Office Action dated Dec. 8, 2016", 8 pgs.
"U.S. Appl. No. 15/840,608, Examiner Interview Summary dated Sep. 17, 2019", 3 pgs.
"U.S. Appl. No. 15/840,608, Non Final Office Action dated Mar. 14, 2019", 7 pgs.
"U.S. Appl. No. 15/840,608, Notice of Allowance dated Oct. 4, 2019", 7 pgs.
"U.S. Appl. No. 15/840,608, Preliminary Amendment filed Jun. 13, 2018", 6 pgs.
"U.S. Appl. No. 15/840,608, Response filed Sep. 16, 2019 to Non-Final Office Action dated Mar. 14, 2019", 8 pgs.
"International Application Serial No. PCT/US2013/062271, International Preliminary Report on Patentability dated Apr. 9, 2015", 8 pgs.
"International Application Serial No. PCT/US2013/062271, International Search Report dated Dec. 20, 2013", 4 pgs.
"International Application Serial No. PCT/US2013/062271, Written Opinion dated Dec. 20, 2013", 6 pgs.
"International Application Serial No. PCT/US2013/062368, International Preliminary Report on Patentability dated Apr. 9, 2015", 8 pgs.
"International Application Serial No. PCT/US2013/062368, International Search Report dated Dec. 20, 2013", 4 pgs.
"International Application Serial No. PCT/US2013/062368, Written Opinion dated Dec. 20, 2013", 6 pgs.
"Relay Contact Life", TE Connectivity Relay Products Application Note, [online]. Retrieved from the Internet: <URL: http://www.te.com/commerce/DocumentDelivery/DDEController?Action=srchrtrv&DocNm=13C3236_AppNote&DocType=CS&DocLang=EN, (Accessed Jul. 27, 2014), 3 pgs.
"Section 01: Introduction", Power Relays, TE Connectivity, [online]. Retrieved from the Internet: <URL: http://www.te.com/en/products/relay-products/application-notes.f1_Schrack.html>, (Jun. 24, 2013), 2 pgs.
"Section 02: Relays—General", Power Relays, TE Connectivity, [online]. Retrieved from the Internet: <URL: http://www.te.com/en/products/relay-products/application-notes.f1_Schrack.html>, (Jun. 24, 2013), 5 pgs.
"Section 03: Electromechanical Relays", Power Relays, TE Connectivity, [online]. Retrieved from the Internet: <URL: http://www.te.com/en/products/relay-products/application-notes.f1_Schrack.html>, (Jun. 24, 2013), 3 pgs.
"Section 04: Contact System", Power Relays, TE Connectivity, [online]. Retrieved from the Internet: <URL: http://www.te.com/en/products/relay-products/application-notes.f1_Schrack.html>, (Jun. 24, 2013), 52 pgs.
"Section 05: Magnetic System—Coil", Power Relays, TE Connectivity, [online]. Retrieved from the Internet: <URL: http://www.te.com/en/products/relay-products/application-notes.f1_Schrack.html>, (Jun. 24, 2013), 28 pgs.

(56) References Cited

OTHER PUBLICATIONS

"Section 06: Mechanical Components", Power Relays, TE Connectivity, [online]. Retrieved from the Internet: <URL: http://www.te.com/en/products/relay-products/application-notes.f1_Schrack.html>, (Jun. 24, 2013), 14 pgs.

"Section 07: Handling & Use in Production", Power Relays, TE Connectivity, [online]. Retrieved from the Internet: <URL: http://www.te.com/en/products/relay-products/application-notes.f1_Schrack.html>, (Jun. 24, 2013), 6 pgs.

"Section 08: Quality Aspects", Power Relays, Connectivity, [online]. Retrieved from the Internet: <URL: http://www.te.com/en/products/relay-products/application-notes.f1_Schrack.html>, (Jun. 24, 2013), 6 pgs.

"Section 09: Standards", Power Relays, TE Connectivity, [online]. Retrieved from the Internet: <URL: http://www.te.com/en/products/relay-products/application-notes.f1_Schrack.html>, (Jun. 24, 2013), 3 pgs.

"Section 10: Electronics in and Around Power Relays", Power Relays, TE Connectivity, [online]. Retrieved from the Internet: <URL: http://www.te.com/en/products/relay-products/application-notes.f1_Schrack.html>, (Jun. 24, 2013), 5 pgs.

"The application of relay coil suppression with DC relays", TE Connectivity Relay Products Application Note, [online]. Retrieved from the Internet: <URL: file:///C:/Users/Kolbow/Downloads/ENG_CS_13C3311_AppNote_0513_Application_of_Coil_Suppression_with_DC_relays_13c3311%20(1).pdf>, (Accessed Jul. 27, 2014), 2 pgs.

\* cited by examiner

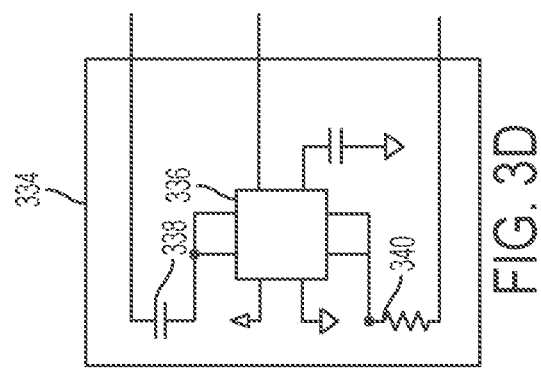
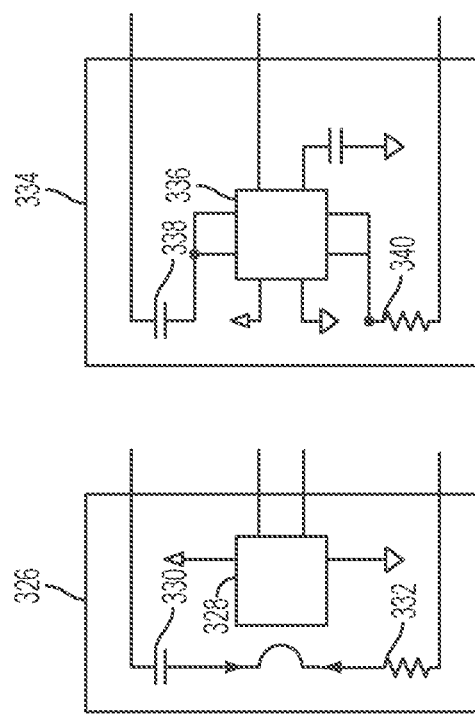
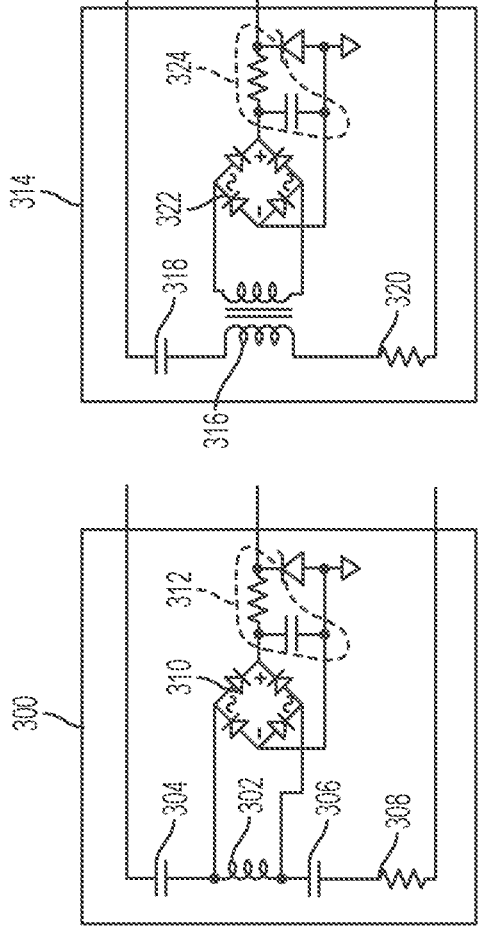
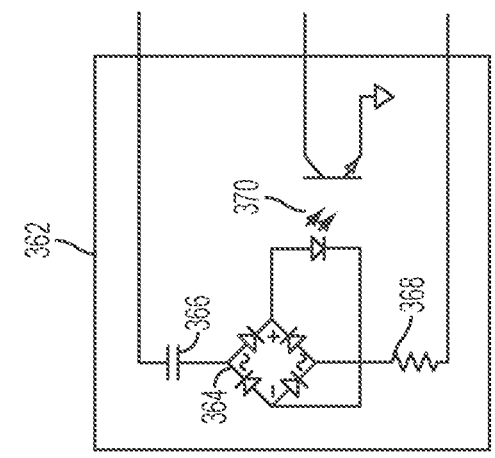
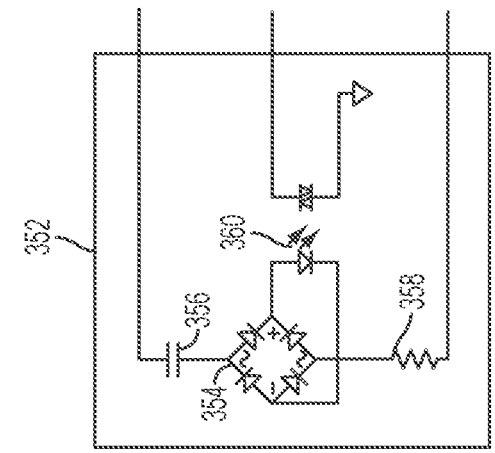
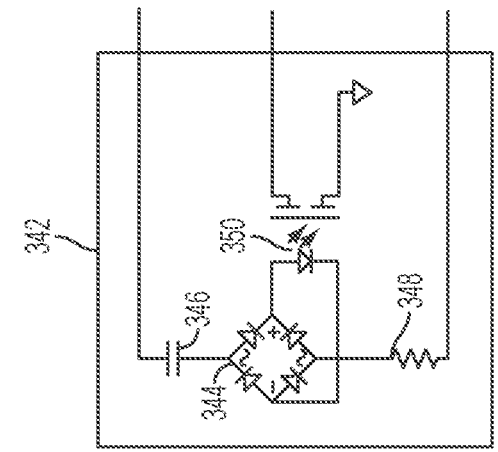

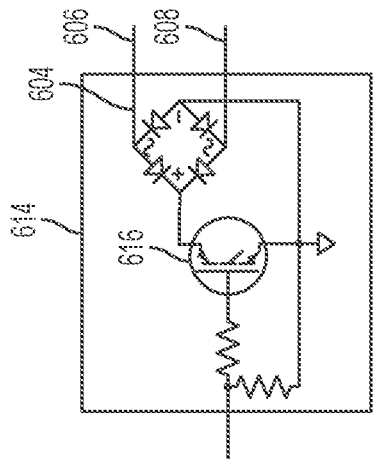
FIG. 6A
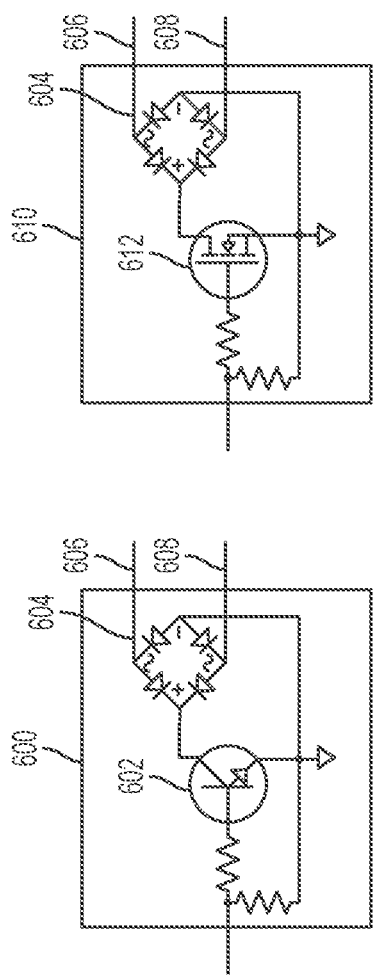
FIG. 6B
FIG. 6C
FIG. 6D
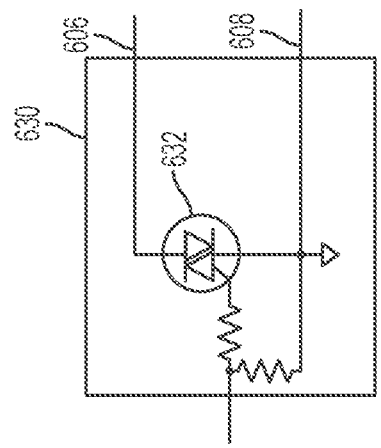
FIG. 6F
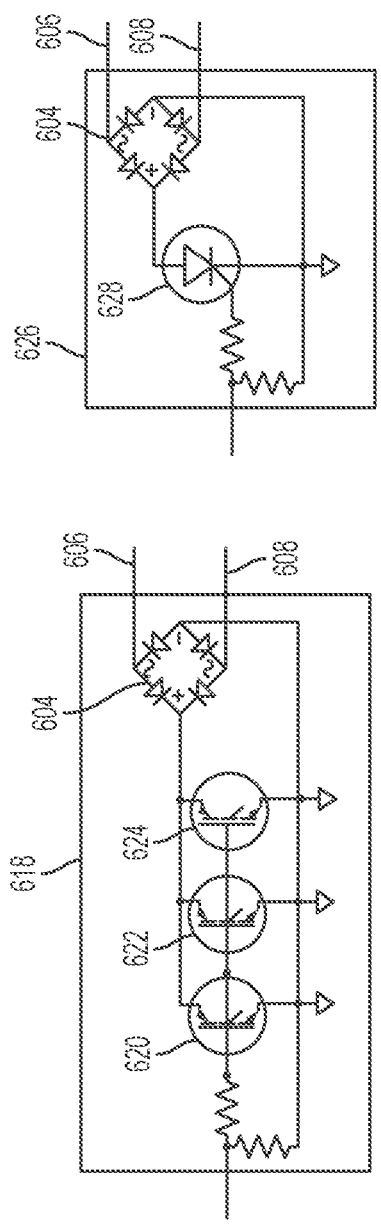
FIG. 6E

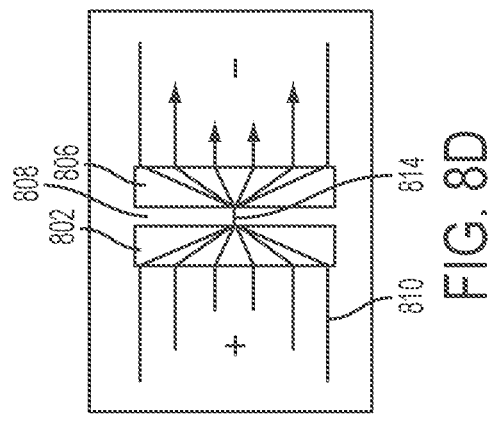
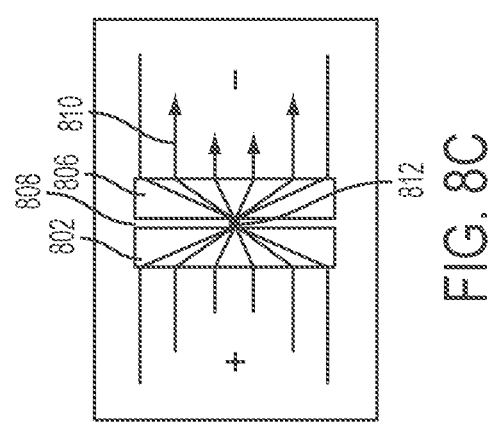
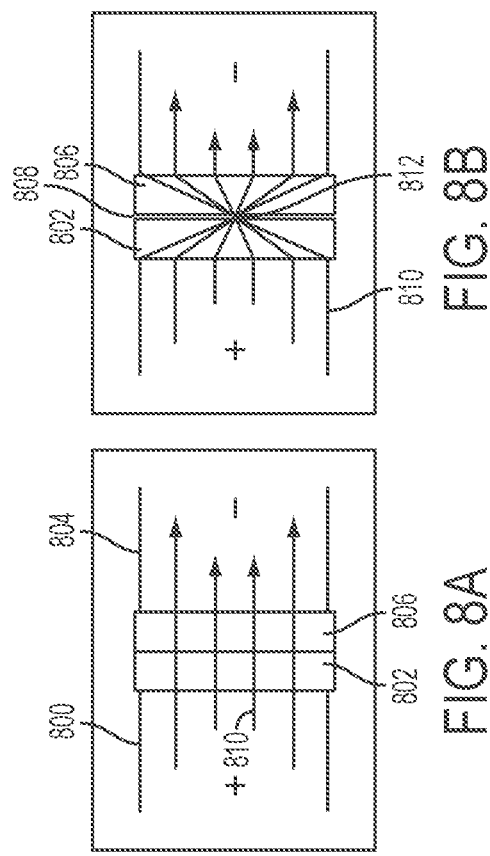
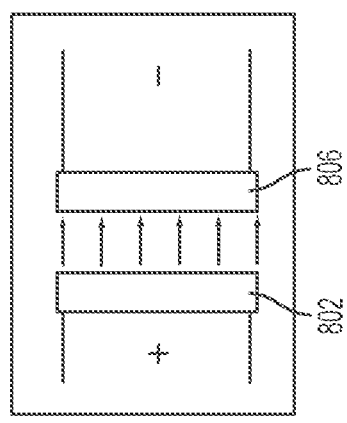
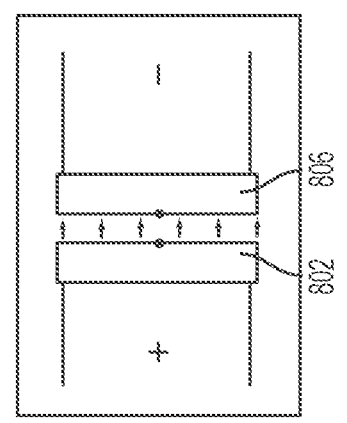
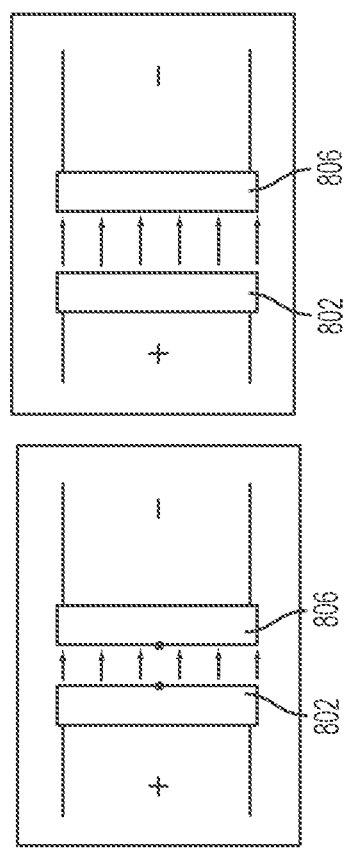
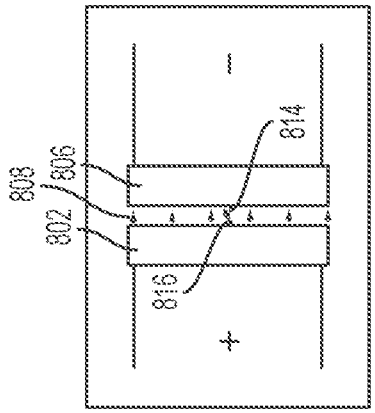
FIG. 8A  FIG. 8B  FIG. 8C  FIG. 8D  FIG. 8E  FIG. 8F  FIG. 8G  FIG. 8H

ARC SUPPRESSOR, SYSTEM, AND METHOD

PRIORITY

This application is a continuation application of U.S. patent application Ser. No. 15/840,608, filed Dec. 13, 2017, which application is a continuation application of U.S. patent application Ser. No. 15/243,257, filed Aug. 22, 2016, issued on Dec. 19, 2017 as U.S. Pat. No. 9,847,185, which is a continuation application of U.S. patent application Ser. No. 14/039,889, filed Sep. 27, 2013, issued on Aug. 23, 2016 as U.S. Pat. No. 9,423,442, which application claims the benefit of priority to both U.S. Provisional Application Ser. No. 61/788,786, filed Mar. 15, 2013 and U.S. Provisional Application Ser. No. 61/707,373, filed Sep. 28, 2012, all of which are incorporated by reference herein in their entireties.

TECHNICAL FIELD

The present application relates generally to electrical current contact arc suppression.

BACKGROUND

Electrical current contact arcing may have a deleterious effects on electrical contact surfaces, such as of relays and certain switches. Arcing may degrade and ultimately destroy the contact surface over time and may result in premature component failure, lower quality performance, and relatively frequent preventative maintenance needs. Additionally, arcing in relays, switches, and the like may result in the generation of electromagnetic interference (EMI) emissions. Electrical current contact arcing may occur both in alternating current (AC) power and in direct current (DC) power across the fields of consumer, commercial, industrial, automotive, and military applications. Because of its prevalence, there have literally been hundreds of specific means developed to address the issue of electrical current contact arcing.

BRIEF DESCRIPTION OF THE DRAWINGS

Some embodiments are illustrated by way of example and not limitation in the figures of the accompanying drawings.

FIGS. 3A-3G are schematic diagrams of example embodiments of contact separation detectors.

FIGS. 6A-6F depicts schematic diagrams illustrating example embodiments of contact bypass circuits.

FIGS. 8A-8H depict an abstract example of a contact breaking sequence in a contact being coupled to an arc suppressor.

DETAILED DESCRIPTION

Figure 1:
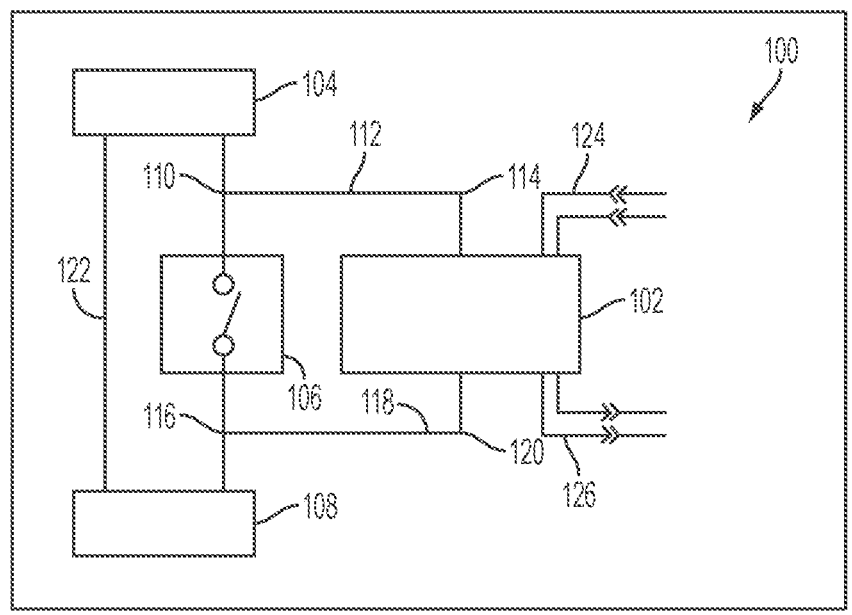
FIG. 1 is a diagram of a system including an arc suppressor, in an example embodiment.

Arc suppression devices that have been developed in the art may be categorized according to three broad categories. Such categories may include: the use of devices, the design of contacts, and the use of discrete components.

With respect to the use of devices, various hybrid power switching devices have been developed to address the effects of contact current arc suppression. These devices typically rely on a coil or other input information to infer the presence of an arc. The use of an input triggered by the coil activation of a relay may be problematic, as the timing of coil activation and contact separation may vary over the operating life of the relay. The use of an optical arc detection input may be problematic, as the arc may occur so fast that the arc may be completed before an optical signal may be both read and acted upon.

With respect to contact design, various types of contact design have also been employed to combat the effects of contact current arc suppression. Relatively larger contact surfaces, such as may be typical of contactors, and/or contacts made of relatively more durable metals may simply take longer for arcing to destroy than may be the case with conventional contacts. Contacts have been used in a gap environment, such as a vacuum or a liquid or gas environment, that suppresses the arc. Magnets have been utilized to magnetically suppress arcs.

With respect to discrete components, current limiters, voltage limiters and risetime limiters have been utilized to attempt to address the effects of contact current arc suppression. RC snubbers, for example, are a series combination of a resistor and a capacitor in order to provide EMI suppression and voltage risetime (dV/dt) reduction. Snubbers may limit some EMI from an arc; however, snubbers may be of reduced or minimal effectiveness in actually suppressing an arc. Voltage suppressors, such as a metal oxide varistor (MOV), a transient voltage suppressor (TVS) diode, and zener diodes have also been utilized. Voltage suppressors may address the over-voltages created by an inductive load during certain stages of contact separation, but may not actually suppress the arc.

Such previous efforts at arc suppression may lessen an effect of an arc without fundamentally or significantly reducing the arc itself. While snubbers may be commonly utilized to reduce the EMI effect of an arc, snubbers may have little impact on protecting the contacts against the physical effects of the arc. Similarly, while contacts may be reinforced to improve their resistance to the effects of arcing, reinforcement may merely delay the physical impact of an arc while also failing to reduce other effects and, at the same time, increase the size and cost of the contact.

An arc suppressor has been developed that may interrupt, at least in part, undesirable contact arcing and potentially protect, at least in part, a contact from deleterious effects. The arc suppressor may utilize a processor (the processor being any of a variety of suitable electronic components, as disclosed herein) to control the connection of a bypass across the contacts. A contact separation detector may detect a condition indicative of a separation of the contacts, such as a change in voltage and/or current, as disclosed herein, and output an indication of the contact separation. The indication may be output directly to the bypass, in which case a processor may not necessarily be utilized, or to the processor, which may connect the bypass over the contacts. Connecting the bypass over the contacts may thereby reduce the energy over the contacts until the conditions over or between the contacts that may cause or lead to an arc have passed. As such, the arc may not form in the first instance or may not form past an initial non-damaging level or "arclet", as disclosed herein. The arc suppressor may significantly reduce electromagnetic emissions resulting from contact arcing in contrast to alternative methodologies, in various examples owing to the arc having been extinguished or substantially reduced. The arc suppressor may be relatively scalable to cover a range of applications from low power to high power, from small size to large size, and from simple to complex.

In various examples, the arc suppressor may monitor and indicate the status of a contact. While the arc suppressor disclosed herein will be discussed in particular with respect to electrical contacts, it is to be recognized and understood that the arc suppressor may inherently be applicable with respect to other electrical members between which an arc may form, such as fixed electrodes and the like. In various examples, the arc suppressor may detect electrical changes related, at least in part, to the contact, such as contact voltage and current through an RC circuit coupled over the contact. In various examples, the arc suppressor does not have a significant power-on current pass through. The arc suppressor may reduce overstress on a capacitor in the RC circuit relative to other arc suppression technologies. In various examples, the arc suppressor does not generate more current leakage than an RC snubber known in the art.

In various examples, the arc suppressor does not singly rely on current change detection or voltage change detection for bypass element triggering. Rather, the arc suppressor may utilize or rely upon both current change detection and voltage change detection. In various examples, the arc suppressor may reduce, eliminate, or substantially eliminate spurious oscillation.

In various examples, the arc suppressor may permit contacts to be constructed relatively smaller and of relatively less exotic material than contacts of alternative arc suppression technologies, owing, for instance, to the reduced potential for damage to the contacts from arcing over alternative arc suppression technologies. Additionally, in various examples, the arc suppressor may allow contacts to operate at a faster rate, at higher ambient temperatures, and at higher duty cycles than contemporary contacts designed to operate with alternative arc suppression technologies. In various examples, the arc suppressor may be connectorizable and contact agnostic, contactor agnostic, hook-up agnostic, load agnostic, polarity agnostic, power agnostic, and device agnostic (that is to say, the arc suppressor works on switch contacts, relay contacts, and/or contactor contacts).

In various examples, the arc suppressor may be implementable in semiconductor technology and be micro-miniaturizable. In various examples, the arc suppressor may be integrated into a conventional relay case or within the case of other electronic circuits or devices. In various examples, the arc suppressor may be applied to the regulation of electronic circuitry in ways that are not necessarily limited to arc suppression circumstances, such as in the detection of an arc without necessarily intending to suppress the arc. In various examples, the arc suppressor switchably or alternatively operates on DC and on AC power, and, in various examples, on DC and AC power concurrently. In various examples, the are suppressor operates on DC or AC power. In various examples, the arc suppressor operates on external power. In various examples, the arc suppressor operates on internal power.

The arc suppressor may extend, at least in part, the life of contacts used in switches, relays, and contactors, among other potential circuits or components, used to switch either an alternating current (AC) and/or a direct current (DC) source to a load. The arc suppressor can, in various examples, suppress arcing, suppress electromagnetic interference, suppress of the creation of fine particles, suppress deleterious effects to the contact, extend contact life, and improve contact performance.

FIG. 1 is a diagram of a system 100 including an arc suppressor 102 as disclosed herein. While the are suppressor 102 will be discussed herein with respect to electrical contacts, it is to be recognized and understood that the arc suppressor 102 may be equally applicable to any of a variety of components and circumstances in which an arc may tend to form, such as physically fixed electrodes and the like. The discussion of the arc suppressor 102 with respect to electrical contacts does not limit the applicable scope of the arc suppressor 102 only to electrical contacts.

The system 100 includes a power source 104, a contact 106, and a load 108. The power source 104 may be an AC power source or a DC power source. Sources for AC power may include generators, alternators, transformers, and the like. The source for AC power may be sinusoidal, non-sinusoidal, or phase controlled. An AC power source may be utilized on a power grid (e.g., utility power, power stations, transmission lines, etc.) as well as off the grid, such as for rail power. Sources for DC power may include various types of power storage, such as batteries, solar cells, fuel cells, capacitor banks and thermopiles, dynamos, and power supplies. DC power types may include direct, pulsating, variable, and alternating (which may include superimposed AC, full wave rectification and half wave rectification). DC power may be associated with self-propelled applications, i.e., articles that drive, fly, swim, crawl dive, tunnel, dig, cut, etc.

The contact 106 may be a switch, relay, contactor, or other contact. The contact 106 includes a pair of contacts, such as electrodes, as illustrated herein. As noted above, the contact 106 may alternative be a static electrode or electrodes or other component over which an arc may tend to form. The load 108 may be a general purpose load, such as consumer lighting, computers, data transfer switches, etc. The load 108 may be a resistive load, such as a resistor, heater, electroplating device, etc. The load 108 may be a capacitive load, such as a capacitor, capacitor bank, power supply, etc. The load 108 may be an inductive load, such as an inductor, transformer, solenoid, etc. The load 108 may be a motor load, such as a motor, compressor, fan, etc. The load 108 may be a tungsten load, such as a tungsten lamp, infrared heater, industrial light, etc. The load 108 may be a ballast load, such as a fluorescent light, neon light, light emitting diode (LED), etc. The load 108 may be a pilot duty load, such as a traffic light, signal beacon, control circuit, etc.

In the illustrated example, connection between the power source 104 and the contact 106 is via a non-switched contact current node 110. Connection between the contact 106 and the arc suppressor 102 is optionally via a wire connection 112 affixed to a wire terminal 114 of the arc suppressor 102.

Connection between the contact 106 and the load 108 is optionally via a switched contact current node 116. A second connection between the contact 106 and the arc suppressor 102 is optionally via a wire connection 118 affixed to a wire terminal 120 of the arc suppressor 102. Connection between the load 108 and the power source 104 is optionally via a return wire connection 122. Thus, the arc suppressor 102 is connected directly in parallel with the contact 106 to be protected.

The arc suppressor 102 may optionally be coupled to an external power supply via a power supply connection 124. The arc suppressor 102 may further optionally be coupled to an external status monitor via a status monitor connection 126. It is emphasized that, as with various components of the system 100, while the power supply connection 124 and status monitor connection 126 are illustrated, such components are optional and may not be included in various examples of the system 100.

Arc Suppressor Block Diagram

Figure 2:
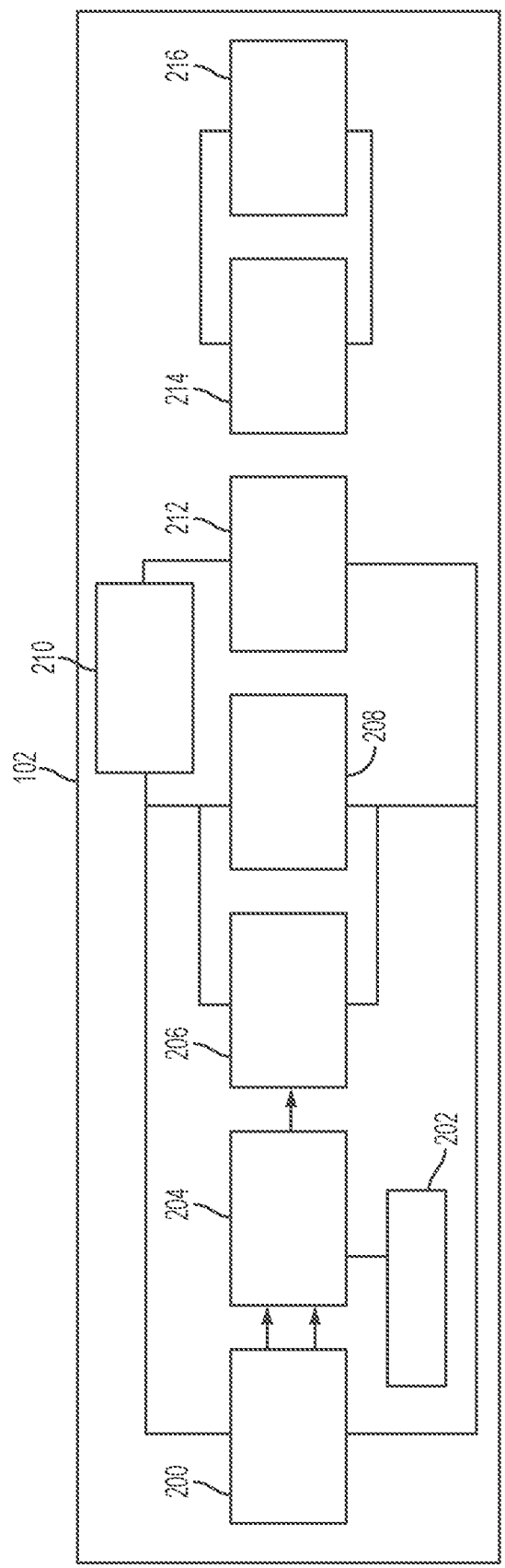
FIG. 2 is a block diagram of an example of an arc suppressor, in an example embodiment.

FIG. 2 is a block diagram of an example of the arc suppressor 102. The arc suppressor 102 optionally includes some or all of a contact separation detector 200, an indicator 202, a processor 204, a contact bypass circuit 206, a component protection circuit 208, a protection circuit 210, a connection termination 212, a power connection 214, and a power supply 216. While the contact separation detector 200 disclosed herein may be described with respect to contacts, it is to be understood that the contact separation detector 200 may be applicable to detecting an arc generally without respect to contact separation. Thus, in examples in which the arc suppressor 102 is utilized with respect to components other than contacts, the contact separation detector 200 may be understood as an arc detector or arc condition detector.

The block diagram of the arc suppressor 102 includes elements of the arc suppressor 102 generically and without respect to specific voltage, current or power ratings. In various specific implementations, the various blocks may be scaled according to component ratings such as, but not limited to, resistance, capacitance, inductance, voltage, current, power, tolerance, and transformation ratio, to construct specific arc suppressors.

The contact separation detector 200 may detect a condition indicative of a separation of the contact 106, such as a change in voltage and/or current, as disclosed herein. The condition indicative of the separation of the contacts 106 may more generally be a condition indicative of an arc or a formation of an arc, and circumstances in which the contact separation detector 200 is utilized without respect to contacts may produce a detection and an indication of an arc or a condition indicative of an arc. The contact separation detector 200 may, in various examples, output an analog signal that, at relatively low values, indicates a condition, such as a contact separation state, that may not necessarily result in the bypass of the contacts 106. The contact separation detector 200 may, in various examples, output an analog signal that, at relatively higher values, indicates the formation of an arc, as disclosed herein, that may result in bypassing the contacts 106. The values of those indications may be dependent on the circumstances in which the contact separation detector 200 is applied and may be utilized by one or more of the indicator 202, processor 204, and bypass 206 to variously indicate the separations state of the contact 106, indicate an arc condition over the contact 106, and/or bypass the contact 106, as appropriate.

The contact separation detector 200 may output an indication of the contact separation. As illustrated, the indicator is provided to the processor 204. However, in various examples, the indicator may be provided, alternatively or additionally, to the indicator 202 and/or to the contact bypass circuit 206 without respect to the processor 204. On the basis of receiving the indication, the processor 204 may output a trigger signal to engage the electrical bypass of the contact bypass circuit 206 over the contact 106. Alternatively, the contact bypass circuit 206 may receive the indication directly from the contact separation detector 200 and engage the bypass over the contact 106. By bypassing the contact 106 during at least a portion of the time during which the arc may form or tend to form over the contact 106, the energy over the contact 106 may be reduced to levels that may not produce an arc until the conditions within the contact 106 that may cause an arc have passed or otherwise subsided.

The component protection circuit 208 and the protection circuit 210 may provide protection for the various components within the arc suppressor 102. In various examples, the component protection circuit 208 includes one or more of a varistor, a transient voltage suppressor, and back-to-back Zener diodes coupled in parallel with one or more of the contact separation detector 200, the processor 204, and the contact bypass circuit 206. In various examples, the protection circuit 210 includes one or more of a fuse, a resistor, a circuit breaker, and a fusible link coupled in series with one or more of the contact separation detector 200, the processor 204, the contact bypass circuit 206, and the component protection circuit 208.

The connection termination 212 may be a component of the contact 106 itself and may, in various examples, not be considered a component of the arc suppressor 102. In various alternative examples, the arc suppressor 102 may be considered an integral component of the contact 106. The contact termination 212 may be one or more of wire terminals, a pluggable connector, a card-edge connector, and flying leads. The power connection 214 and power supply 216 may optionally supply power to the arc suppressor 102 as a whole, such as to the processor 204. The power connection 214 may be any one or more of wire terminals, a pluggable connector, a card-edge connector, flying leads, and a power connector. The power supply 216 may be any one or more of a battery, a capacitor, one or more voltage regulators, and one or more power regulators.

The arc suppressor 102 may be implemented according to any of a variety of embodiments of some or all of the blocks 200, 202, 204, 206, 208, 210, 212, 214, 216. While specific embodiments are presented in detail herein, it is to be understood that alternative embodiments may be implemented. The particular embodiments may be configured to provide desired performance characteristics, such as for the circumstances in which the arc suppressor 102 is used. The particular embodiments disclosed herein are for the purposes of example and illustration and are not limiting on the implementations disclosed herein.

Contact Separation Detector

FIGS. 3A-3G are schematic diagrams of examples of contact separation detectors. The various contact separation detectors may be utilized in the arc suppressor 102 as the contact separation detector 200. However, it is to be recognized and understood that the contact separation detectors disclosed herein may be applicable in any of a variety of circumstances in the detection of the separation of electrical contacts.

In general, the contact separation detectors disclosed herein may detect one or both of a change in voltage over the contact 106 as the contact separates and a change in current through the contact separation detector owing to the separation of the contact 106. The generation of at least one of a current change or a voltage change in one or more components of the contact separation detector may cause an output that may be indicative of the separation of the contact 106. The output may be utilized to suppress an arc within the contact 106 or for any other suitable purpose. It is to be noted and recognized that the contact separation detectors may inherently detect an arc or an indication of an arc generally without necessarily detecting the separation of contacts.

In various examples, the contact separation detector measures the current of an RC circuit using a current sense transformer. In various examples, the contact separation detector measures the current of the RC circuit using a current sensor. In various examples, the contact separation detector measures the current of the RC snubber using a Hall Effect sensor. In various examples, the contact separation detector measures the current of the RC circuit using a transformer. In various examples, the contact separation detector measures the current of the RC circuit using an inductor. In various examples, the contact separation detector may monitor a contact status without ultimately resulting in arc suppression.

FIG. 3A depicts a schematic diagram illustrating an example of a contact separation detector 300. The contact separation detector 300 as illustrated includes an inductor 302 in series with a first capacitor 304, a second capacitor 306, and a resistor 308. The capacitors 304, 306 and the resistor 308 may function, individually or as a whole, as an RC circuit, as known in the art.

As illustrated, a bridge rectifier 310 is coupled over the inductor 302. The bridge rectifier 310 may measure the current through the RC circuit by producing an output based on a voltage change over the inductor 302. The change in voltage over the inductor 302 is subject to full-wave rectification to provide a higher-voltage DC pulse. An RC filter 312 provides filtering of the rectified output of the bridge rectifier 310. The output of the RC filter 312 may thus act as an indication of a separation state of the contact 106.

FIG. 3B depicts a schematic diagram illustrating an example of a contact separation detector 314. The contact separation detector 314 as illustrated includes a transformer 316 in series with a capacitor 318 and a resistor 320 that may function as an RC circuit, as known in the art. As illustrated, a bridge rectifier 322 is coupled over the inductor transformer 316. The bridge rectifier 322 may indicate a current through the RC circuit by producing an output based on a voltage change over the inductor transformer 316. The change in voltage over the transformer 316 is subject to full-wave rectification to provide a higher-voltage DC pulse than what may be present in the change over the transformer 316. An RC filter 324 provides filtering of the rectified output of the bridge rectifier 322. The output of the RC filter 324 may thus act as an indication of a separation state of the contact 106.

FIG. 3C depicts a schematic diagram illustrating an example of a contact separation detector 326. The contact separation detector 326 as illustrated includes a Hall-effect switch 328 in series with a capacitor 330 and a resistor 332 that may function as an RC circuit. The Hall-effect switch 328 may produce an output indicative of a current through the RC circuit based on a sensed magnetic field induced by the current through the RC circuit. The current output of the Hall-effect switch 328 may act as an indication of a separation state of the contact 106. The output of the Hall-effect switch 328 may be a binary state indication of contact separation and the Hall-effect switch 328 may be selected according to a desired threshold to indicate a binary condition of a contact separation state based on the input to the Hall-effect switch 328.

FIG. 3D depicts a schematic diagram illustrating an example of a contact separation detector 334. The contact separation detector 334 as illustrated includes a Hall effect current sensor 336 coupled in series between a capacitor 338 and a resistor 340 that may function as an RC circuit. The Hall-effect current sensor 336 may produce an output indicative of a current through the RC circuit based on a sensed magnetic field induced by the current through the RC circuit. The current output of the Hall-effect current sensor 336 may act as an indication of a separation state of the contact 106. In contrast to the Hall-effect switch 328, the Hall-effect current sensor 336 may produce an analog output that is indicative not of a binary state but of a variety of potential states, such as that contacts have separated or that an arc has formed or is in the process of forming, as disclosed herein.

The examples illustrated in FIGS. 3E-3G incorporate isolation elements, such as solid state relay, an opto-triac, and an opto-transistor. It is to be recognized and understood that alternative examples that include alternative isolation elements may be utilized in addition to or in place of the isolation elements disclosed herein.

FIG. 3E depicts a schematic diagram illustrating an example of a contact separation detector 342. The contact separation detector 342 as illustrated includes a bridge rectifier 344 in series with a capacitor 346 and a resistor 348 that may function as an RC circuit. A solid state relay 350 is coupled over the output of the bridge rectifier 344. The solid state relay 350 may produce an output indicative of a current through the RC circuit based on the output of the bridge rectifier 344. The output of the solid state relay 350 may act as an indication of a separation state of the contact 106.

FIG. 3F depicts a schematic diagram illustrating an example of a contact separation detector 352. The contact separation detector 352 as illustrated includes a bridge rectifier 354 in series with a capacitor 356 and a resistor 358 that may function as an RC circuit. An opto-triac 360 is coupled over the output of the bridge rectifier 354. The opto-triac 360 may produce an output indicative of a current through the RC circuit based on the output of the bridge rectifier 354. The output of the opto-triac 360 may act as an indication of a separation state of the contact 106.

FIG. 3G depicts a schematic diagram illustrating an example of a contact separation detector 362. The contact separation detector 362 as illustrated includes a bridge rectifier 364 in series with a capacitor 366 and a resistor 368 that may function as an RC circuit. An opto-transistor 370 is coupled over the output of the bridge rectifier 364. The opto-transistor 370 may produce an output indicative of a current through the RC circuit based on the output of the bridge rectifier 364. The output of the opto-transistor 370 may act as an indication of a separation state of the contact 106.

Indicator

FIGS. 4A-4E depict schematic diagrams illustrating examples of indicators. The indicators may be incorporated in the arc suppressor 106 as the indicator 202 for the purposes of providing a visual, audio, or electrical output indication of a separation of the contact 106. It is to be understood that the indicators are optional and may not intentionally influence the operation of the arc suppressor 102 as a whole.

Figure 4A:
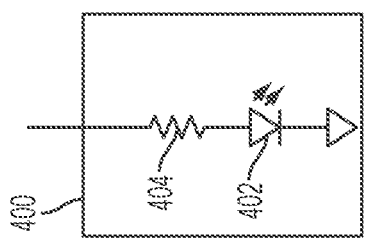
FIGS. 4A-4E depict schematic diagrams illustrating example embodiments of indicators.

FIG. 4A depicts a schematic diagram illustrating an example of an indicator 400 including an LED 402 in series with a resistor 404. The input to the resistor may be coupled to an output of the contact separation detector 200 and/or to the output of the processor 204. A current from the contact separation detector 200 and/or the processor 204 may cause the LED 402 to emit light upon the condition indicative of a separation of the contact 106 is detected, as disclosed herein.

Figure 4B:
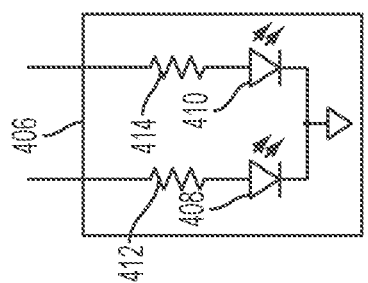

FIG. 4B depicts a schematic diagram illustrating an example of an indicator 406 including first and second LEDs 408, 410, each in series with a first and second resistor 412, 414, respectively. It is to be recognized and understood that the number of LEDs may be increased to provide indications as desired. The indicator 406 may provide multiple indications, such as an output from each of the contact separation detector 200 and the processor 204, such as that may, for instance, inform an observer of a condition that meets a threshold for contact separation but not arc suppression.

Figure 4C:
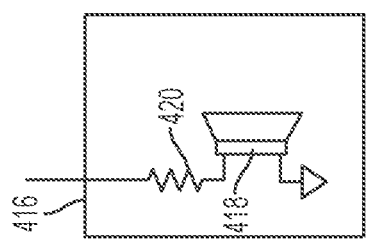

FIG. 4C depicts a schematic diagram illustrating an example of an indicator 416 including a speaker 418 configured to provide an audible output. As illustrated, the speaker 418 is in series with a resistor 420 sized to provide a suitable voltage drop over the speaker 418. A current from the contact separation detector 200 and/or the processor 204 may cause the speaker 418 to create an audible tone upon the condition indicative of a separation of the contact 106 is detected, as disclosed herein.

Figure 4D:
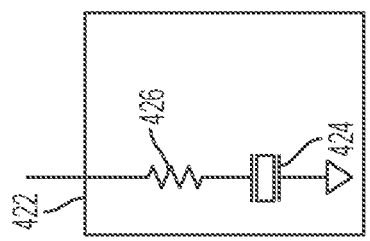

FIG. 4D depicts a schematic diagram illustrating an example of an indicator 422 including a piezoelectric transducer 424 configured to provide an audible output. As illustrated, the piezoelectric transducer 424 is in series with a resistor 426 sized to provide a suitable voltage drop over the speaker 424. A current from the contact separation detector 200 and/or the processor 204 may cause the piezoelectric transducer 424 to create an audible tone upon the condition indicative of a separation of the contact 106 is detected, as disclosed herein.

Figure 4E:
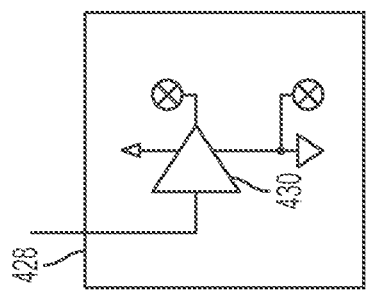

FIG. 4E depicts a schematic diagram illustrating an example of an indicator 428 including a transmission line driver 430 configured to transmit an indication of a separation of the contact 106 to a secondary device (not pictured). The secondary device may be any of a variety of devices that may utilize information relating to a separation status of the contact 106. The transmission line driver 430 may reproduce a voltage or current as received from the contact separation detector 200 and/or the processor 204.

In various examples, the indicator 204 may be configured to indicate one or more of: assumed arcing; connection failure; external failure; failure codes; internal failure; a number of events; a rate of events; internal health of the arc suppressor 102; contact separation; triggerable events; an internal indicator; an output to an external device processing the indicator signal; an output to an external indicator; contact separation detection; and the calculation of an arc suppression factor.

Arc Suppression Processor

FIGS. 5A-5D depicts schematic diagrams illustrating examples of arc suppression processors. The processors may be utilized as the processor 204, as disclosed herein. It is to be understood that, for the purposes of this disclosure, the term "processor" may include the electronic devices disclosed herein, whether or not conventionally described as a "processor", and equivalent devices that may provide the same or similar output as the processors disclosed herein. The processors described herein may be actively powered from a power source. Arc suppressors 102 that do not include a processor as disclosed herein may not necessarily utilize a power source, as disclosed herein.

Figure 5A:
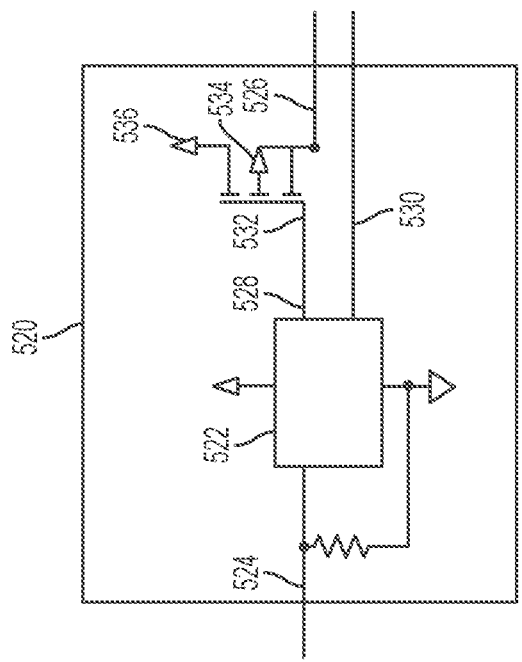
FIGS. 5A-5D depicts schematic diagrams illustrating example embodiments of arc suppression processors.

FIG. 5A depicts a schematic diagram illustrating an example of an arc suppression processor 500 including an analog timer 502. The analog timer 502 may be configured with an input line 504 to receive, from the contact separation detector 200, an indication of contact separation of the contact 106. On the basis of the indication of contact separation, the analog timer 502 may output a signal on an output line 506 that may be utilized by the contact bypass circuit 206 to open a bypass over the contact 106 to suppress an arc in the contact 106.

In an example, the analog timer 502 includes a threshold input terminal 508 and a trigger input terminal 510 that may be configured to set an overall sensitivity to the indication of contact separation. As illustrated, a resistor 512 and capacitor 514 may be selected to set the threshold and trigger sensitivity based on power 516 and ground 518. The threshold and trigger may be selected based on the particular circumstances in which the arc suppressor 102 is being utilized, e.g., the threshold and trigger may be set relatively high for high voltage applications and relatively low for low voltage applications. In an example, the resistor 512 is a ten (10) kiloOhm resistor and the capacitor 514 is a 0.01 microFarad capacitor where power 516 is nine (9) Volts. The output provided by the analog timer 502 will be discussed in detail herein.

Figure 5B:
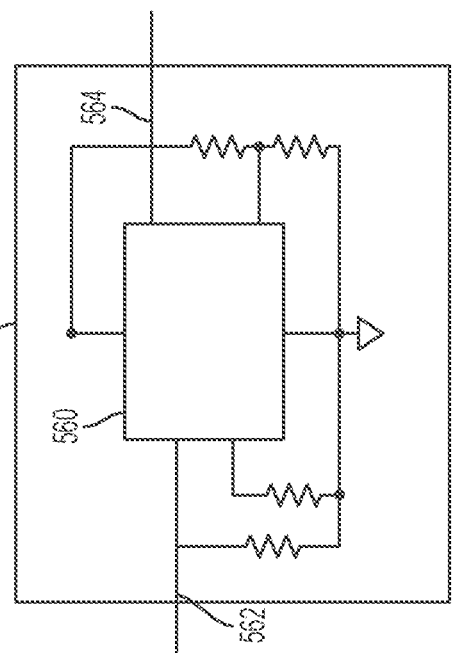

FIG. 5B depicts a schematic diagram illustrating an example of an arc suppression processor 520 including a microcontroller 522. The microcontroller 522 may be configured with an input line 524 to receive an indication, from the contact separation detector 200, of contact separation of the contact 106. On the basis of the indication of contact separation, the processor 520 may output a signal on an output line 526 that may be utilized by the contact bypass circuit 206 to open a bypass over the contact 106 to suppress an arc in the contact 106.

As illustrated, the microcontroller 522 includes two output terminals 528, 530. The first output terminal 528 is coupled to a gate 532 of a transistor 534 which, when enabled by a signal from the microcontroller 522, opens the transistor 534 to provide the signal on the output line 526 at a voltage 536 different than the power voltage 516 for the microcontroller 522. The second output terminal 530 may provide an output signal from the microcontroller 522 for another purpose, such as for generating a signal from the indicator 202, as disclosed herein. It is to be recognized and understood that, in various examples, the processor 520 does not necessarily include two output terminals 528, 530 where a second output is not needed. Further, the transistor 534 may not be needed where the voltage of the output signal from the microcontroller 522 does not need to be changed for use, e.g., by the contact bypass circuit 206.

Figure 5C:
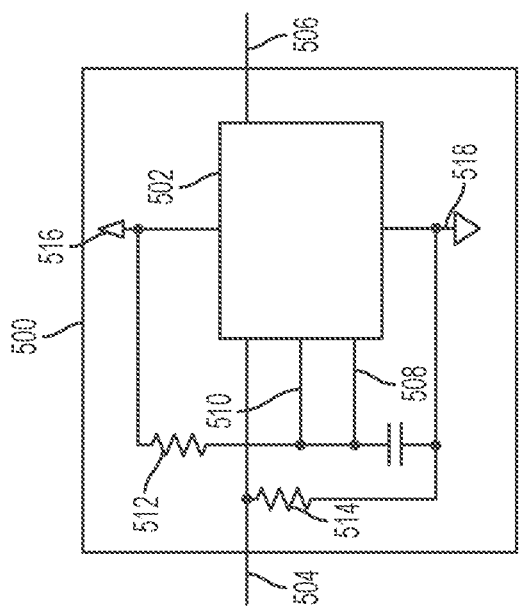

FIG. 5C depicts a schematic diagram illustrating an example of an arc suppression processor 538 including a programmable system on a chip 540. As illustrated, the programmable system on a chip 540 has differential input terminals 542, 544, though it is to be understood that, in various examples, the differential input terminals 542, 544 may be replaced or supplemented with one or more non-differential terminals. The input terminals 542, 544 may receive an input from the contact separation detector 200.

As illustrated, the system on a chip 540 includes two output terminals 546, 548. The first output terminal 546 is coupled to a gate 550 of a transistor 552 which, when enabled by a signal from the system on a chip 540, opens the transistor 552 to provide the signal on the output line 554 at a voltage 556 different than the power voltage 516 for the system on a chip 540. The second output terminal 548 may provide an output signal from the system on a chip 540 for another purpose, such as for generating a signal from the indicator 202, as disclosed herein. It is to be recognized and understood that, in various examples, the processor 520 does not necessarily include two output terminals 546, 548 where a second output is not needed. Further, the transistor 552 may not be needed where the voltage of the output signal from the system on a chip 540 does not need to be changed for use, e.g., by the contact bypass circuit 206.

Figure 5D:
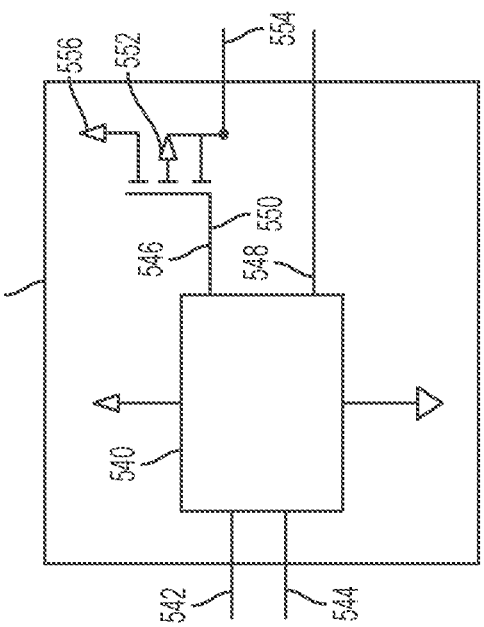

FIG. 5D depicts a schematic diagram illustrating an example of an arc suppression processor 558 including a digital timer 560. The digital timer 560 may be configured with an input line 562 to receive, from the contact separation detector 200, an indication of contact separation of the contact 106. On the basis of the indication of contact separation, the digital timer 560 may output a signal on an output line 564 that may be utilized by the contact bypass circuit 206 to open a bypass over the contact 106 to suppress an arc in the contact 106.

Contact Bypass Circuit

FIGS. 6A-6F depicts schematic diagrams illustrating examples of contact bypass circuits. Any one or more of the contact bypass circuits disclosed herein may be utilized as the contact bypass circuit 206.

FIG. 6A depicts a schematic diagram illustrating an example of a contact bypass circuit 600 including a bipolar junction transistor (BJT) 602 coupled to a bridge rectifier 604. The bridge rectifier 604 is coupled between terminals 606, 608 which are coupled over the contact 106. Upon receiving a trigger signal, such as from the processor 204, the BJT 602 engages the bridge rectifier 604, providing a bypass between the terminals 606, 608 and over the contact 106. Upon the signal ending, the BJT 602 ceases engaging the BJT 602 and the bridge rectifier 604 ceases providing the bypass.

FIG. 6B depicts a schematic diagram illustrating an example of a contact bypass circuit 610 including a field effect transistor (FET) 612 coupled to a bridge rectifier 604. The bridge rectifier 604 is coupled between terminals 606, 608 which are coupled over the contact 106. Upon receiving a trigger signal, such as from the processor 204, the FET 612 engages the bridge rectifier 604, providing a bypass between the terminals 606, 608 and over the contact 106. Upon the signal ending, the FET 612 ceases engaging the BJT 602 and the bridge rectifier 604 ceases providing the bypass.

FIG. 6C depicts a schematic diagram illustrating an example of a contact bypass circuit 614 including an insulated gate bipolar transistor (IGBT) 616 coupled to a bridge rectifier 604. The bridge rectifier 604 is coupled between terminals 606, 608 which are coupled over the contact 106. Upon receiving a trigger signal, such as from the processor 204, the IGBT 616 engages the bridge rectifier 604, providing a bypass between the terminals 606, 608 and over the contact 106. Upon the signal ending, the IGBT 616 ceases engaging the BJT 602 and the bridge rectifier 604 ceases providing the bypass. FIG. 6D depicts a schematic diagram illustrating an example of a contact bypass circuit 618 including multiple insulated gate bipolar transistors (IGBT's) 620, 622, 624 coupled to a bridge rectifier 604. The bridge rectifier 604 is coupled between terminals 606, 608 which are coupled over the contact 106. Upon receiving a trigger signal, such as from the processor 204, the IGBTs 620, 622, 624 engage the bridge rectifier 604, providing a bypass between the terminals 606, 608 and over the contact 106. Upon the signal ending, the IGBT 616 ceases engaging the BJT 602 and the bridge rectifier 604 ceases providing the bypass. Including multiple IGBTs may provide greater robustness in high voltage and high power systems.

FIG. 6E depicts a schematic diagram illustrating an example of a contact bypass circuit 626 including a silicon controlled rectifier (SCR) 628 coupled to a bridge rectifier 604. The bridge rectifier 604 is coupled between terminals 606, 608 which are coupled over the contact 106. Upon receiving a trigger signal, such as from the processor 204, the SCR 628 engages the bridge rectifier 604, providing a bypass between the terminals 606, 608 and over the contact 106. Upon the signal ending, the SCR 628 ceases engaging the BJT 602 and the bridge rectifier 604 ceases providing the bypass.

FIG. 6F depicts a schematic diagram illustrating an example of a contact bypass circuit 630 including a triac 632. Upon receiving a trigger signal, such as from the processor 204, the triac 632 provides a bypass between the terminals 606, 608 and over the contact 106. Upon the signal ending, the triac 632 ceases providing the bypass.

System Current Flow

FIGS. 7A-7D depict schematic diagrams of current flow in a system 100 incorporating the arc suppressor 102. The system 100 may include some or all of the various examples of the components of the system 100 and the arc suppressor 102 described herein. It is to be understood that the description herein may apply to any of a variety of specific systems.

Figure 7A:
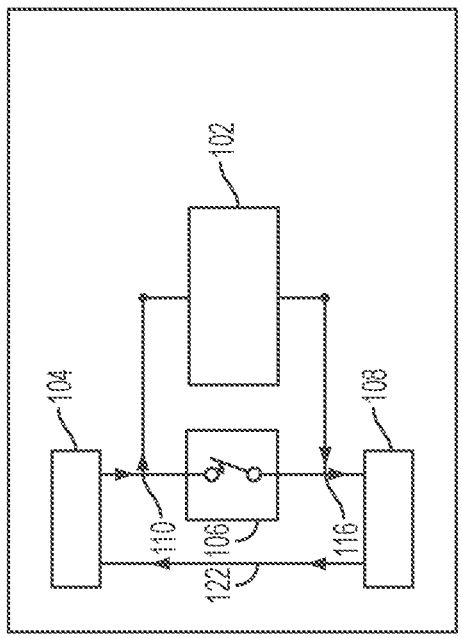
FIGS. 7A-7D depict schematic diagrams of current flow in a system incorporating an arc suppressor, in example embodiments.

FIG. 7A depicts the current flow within the system 100 while the contact 106 is open. In particular, load current does not flow through the current nodes 110, 116 and/or the return wire connection 122.

Figure 7B:
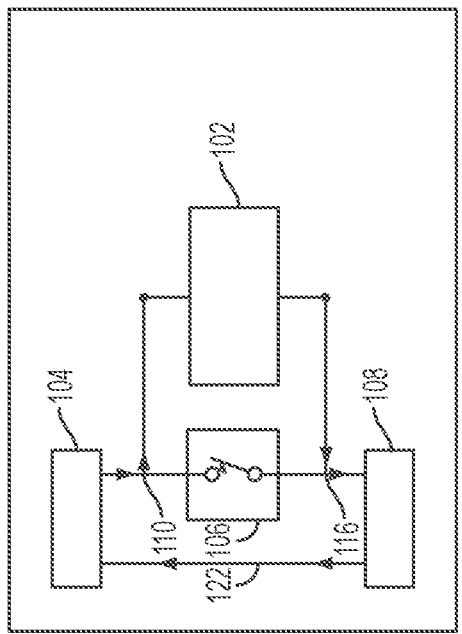

FIG. 7B depicts the current flow within the system 100 while the contact 106 is in the process of closing. After contact separation, such as during contact bouncing as described herein, has been detected, the load current briefly flows through the wire connection 112, the arc suppressor 102, the contact current node 116 and into the load 108. The current returns from the load 108 to the power source 104 via the wire connection 122.

Figure 7C:
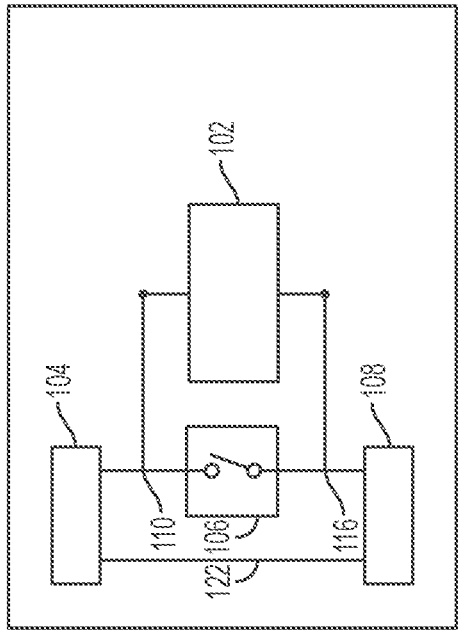

FIG. 7C depicts the current flow within the system 100 while the contact 106 is closed. Load current flows through the wire connection 112, the contact 106, the contact current node 116, and into the load 108. The current returns from the load 108 to the power source 104 via the return wire connection 122.

Figure 7D:
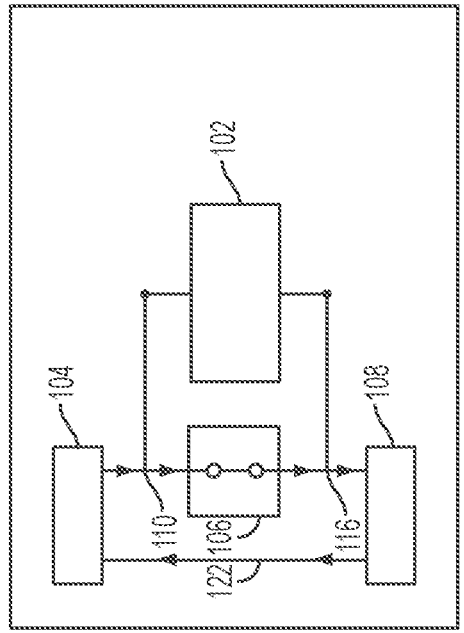

FIG. 7D depicts the current flow within the system 100 while the contact 106 is in the process of opening. After contact separation during contact breaking has been detected, the load current briefly flows through the contact current node 110, the arc suppressor 102, the contact current node 116, and into the load 108. The current returns from the load 108 to the power source 104 via the return wire connection 122.

A contact generally, and the contact 106 specifically, may be understood to cycle through four distinct states: open, make (e.g., during the process of closing), closed, and break (e.g., during the process of opening). The make and break states may be generally transitional and may be of generally short duration. The open and closed states may be generally non-transitional and may be of generally longer duration.

Each state may have specific phases that the contact 106 may travel through in order to make it to the next state. One example of a general switch cycle may start with the OPEN state. After entering the MAKE state the contact 106 may cycle through a "make arc," e.g., an arc that occurs or may tend to occur owing to the making of the connection in the connector 106. The "make arc" may be suppressed by the arc suppressor 102, as disclosed herein. The "make arc" may be followed by multiple "make bounce arclets." e.g., multiple small arcs that may occur owing to the bouncing of the connector 106. A "no-make microweld" may follow the "make bounce arclets," e.g., a micro-conduction over the connector 106 during the process of closing the connector 106, and coming to rest at the generally non-transitional CLOSED state.

From the CLOSED state, the contact 106 may enter the BREAK state, e.g., the breaking of the contact 106 as part of opening the contact 106. The contact 106 may cycle through a "no need to break micro-weld" phase in the event that a micro-weld was not formed, followed a "contact breaks open" phase, which may be followed by one or more "break bounce arclets" in the event the contact 106 bounces during the break. The one or more "break bounce arclets" may be followed by a primary break arclet. e.g., a major break arclet, followed by a break arc that may be suppressed by the arc suppressor 102 as disclosed herein. The primary break arclet may be followed by a secondary break arclet. The arc suppressor 102 may suppress a secondary break arc that may tend to develop in the contact 106, following which the contact 106 may come to the generally non-transitional OPEN state.

A contact arc suppression factor may be determined by measuring the average arc voltage times the average arc current times the arc duration without arc suppression and by measuring the average arclet voltage times the average arclet current times the arclet duration, i.e., with arc suppression from the arc suppressor 102. The average arc suppression factor may be the ratio of the average energy of the arc without arc suppression over the average energy of the residual arc (arclet) with arc suppression. The arclet current may be slightly less than the full load current. Depending on the voltage across the contact and the current through the contact calculation factors may take any range between a factor of greater than one to many thousands.

The residual energy contained within an arclet may tend to clean surfaces of the contact 106, such as by removing oxidization of the contact 106 and contributing to maintaining a smooth contact surface for improved mechanical contact performance. The arc suppressor 102 may suppress arcs but permit the formation of arclets.

Contact Breaking Sequence

FIGS. 8A-8H depict an abstract example of a contact breaking sequence in a contact being coupled to an arc suppressor. The contact may be representative of the contact 106 or other contacts. In various examples, the contact may be coupled to the arc suppressor 102 as disclosed herein.

A first conductor 800 is coupled to a first contact electrode 802 of the contact 106. A second conductor 804 is coupled to a second contact electrode 806. In the CLOSED state the first and second contact electrodes 802, 806 are in physical contact with respect to one another. In the MAKE, OPEN, and BREAK states a gap 808 of varying sizes occurs between the first and second contact electrodes 802, 806 and the and second contact electrodes 802, 806 are not in substantial physical contact with each other.

FIG. 8A depicts the contact 106 in the CLOSED state. As illustrated, current 810 flows through closed first and second contact electrodes 802, 806. Load current is flowing through the contact 106 generally. In such a phase, current density is generally at a minimum.

FIG. 8B depicts a contact BREAK state at a moment of separating the first and second contact electrodes 802, 806, creating the gap 808. Current 810 continues flowing through the contact 106 owing to the ionization of the air in the gap 808, to form an arclet 812. However, because the arclet 812 is relatively small, the current constricts, resulting in increasing current density. In certain examples, material of the contact 106, such as the first and second contact electrodes 802, 806, may start to melt.

FIG. 8C depicts a developing condition of a contact BREAK state. Current 810 continues flowing through the contact 106 owing to the ionization of the air in the gap 808 forming the arclet 812. In certain examples, material of the contact 106, such as the first and second contact electrodes 802, 806, continues to melt and may start to pool.

FIG. 8D depicts a developing condition of a contact BREAK state. Current 810 continues flowing through the contact 106 owing to the ionization of the air in the gap 808. As illustrated, metal of the first and second contact electrodes 802, 806 is molten and a metal bridge 814 forms between the first and second contact electrodes 802, 806.

FIG. 8E depicts a developing condition of a contact BREAK state. The metal bridge 814 rips as the gap 808 grows, stopping the current flow through the contact 106. In various examples, the gap 808 in such a state is approximately two (2) micrometers. The electric field between the first and second contact electrodes 802, 806 has reached the point of dielectric breakdown, which may occurs in form of or otherwise produce a spark 816. It is noted that while an arc may derive from driven current over a contact or electrode, as disclosed herein, a spark may originate from dielectric discharge without respect to a driven current. A spark may precede an arc.

As applied to the arc suppressor 102, the contact separation detector 200 may detect the contact separation. Voltage across the contact 106 is reaching an arc voltage threshold that is detectable by the contact separation detector. In an example, the arc voltage threshold is from approximately nine (9) to fifteen (15) Volts, depending, for instance, on a material composition of the first and second contact electrodes 802, 806.

In various examples, an arc may ignite across the gap 808, allowing load current to flow across the gap 808. The contact bypass circuit 206 may trigger owing to the detection of the contact separation by the contact separation detector 200 and bypasses the load current through the contact bypass circuit 206. In an example, the arc may burn for approximately two (2) microseconds before the contact bypass circuit 206 bypasses the load current, extinguishing the arc. In various examples, the arc does not form in the first instance where the arc suppressor 102 is fast enough to trigger the contact bypass circuit 206 in less time than arc requires to ignite.

Two main parameters can, in various examples, extinguish the arc or prevent the arc from forming in the first instance. First, the arc may extinguish when an amount of charge carries drops below a threshold below which the arc cannot be maintained. Second, the arc may extinguish when the arc length may no longer be thermodynamically be supported. An arc re-ignition space may be the space in the gap 808 at which a voltage over the contact electrodes 802, 806 is less than an arc voltage FIG. 8F depicts a developing condition of a contact BREAK state. The contact 106 is no longer carrying current and the first and second contact electrodes 802, 806 continue to separate. Molten contact metal may begin to cool, while voltage across the contact 106 may be at or approach a maximum.

FIG. 8G depicts a developing condition of a contact BREAK state. The contact 106 is no longer carrying current and the first and second contact electrodes 802, 806 continue to separate. Molten contact metal may begin to harden, while voltage may be at or approximately at a maximum across the contact 106.

FIG. 8H depicts a contact OPEN state. The first and second contact electrodes 802, 806 have reached a resting point and the gap 808 is at a maximum.

With respect to current, during the CLOSED state, as illustrated in FIG. 8A, current through the contact 106 is at or approximately at a maximum. As illustrated, as the contact 106 transitions from the CLOSED to the OPEN state the arc develops and the arc suppressor 102 triggers the contact bypass circuit 206. A resistance of the contact bypass circuit 206 may be lower than a resistance of the arc. Thus, the load current may tend to take the path of least resistance. As a result, the developing arc may be starved of charge carriers, thereby causing the arc to extinguish. After the arc is extinguished, the current through the contact may be at or near zero. A leakage current may continue to flow between the separated first and second contact electrodes 802, 806.

With respect to voltage, during the CLOSED state of the contact 106, voltage across the contact 106 may be at or approximately at a minimum. As the contact transitions from the CLOSED to the OPEN state an arc may begin to develop and the arc suppressor 102 may trigger the contact bypass circuit 206. As the arc is extinguished, the voltage across the contact 106 may reach a maximum or near a maximum. The voltage between the first and second electrical contacts 802, 806 may produce an electrical field within the gap 808.

Contact Making Sequence

FIGS. 9A-9L depict an abstract example of a contact making sequence in a contact being coupled to an arc suppressor. The contact may be representative of the contact 106 or other contacts. In various examples, the contact may be coupled to the arc suppressor 102 as disclosed herein.

Figure 9A:
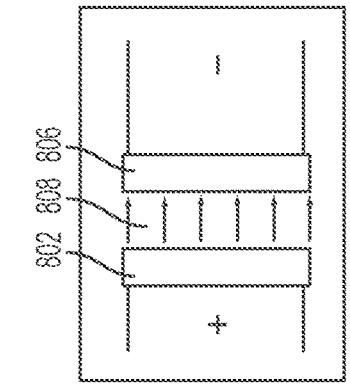
FIGS. 9A-9L depict an abstract example of a contact making sequence in a contact being coupled to an arc suppressor.

FIG. 9A depicts the contact 106 in an OPEN state. The gap 808 exists between the first and second electrical contacts 802, 806 and current is not flowing over the contact 106.

Figure 9B:
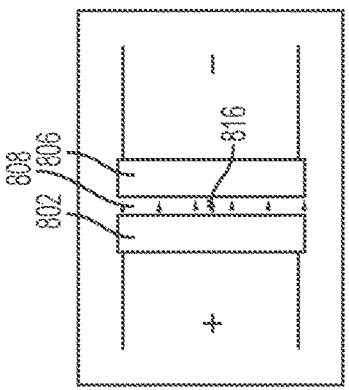

FIG. 9B depicts a contact MAKING state. As illustrated, the gap 808 has closed to the point where a "make spark" 816 may occur between the first and second electrical contacts 802, 806.

Figure 9C:
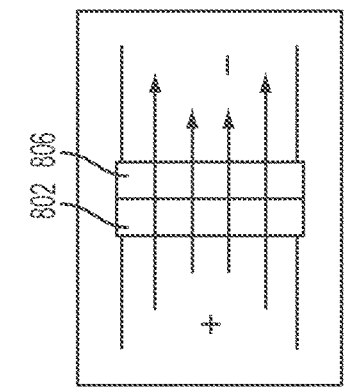

FIG. 9C depicts a developing contact MAKING state where a wire bridge 900 has ignited and is burning in the gap 808. Current 902 flows over the gap 808 by way of the wire bridge 900.

Figure 9D:
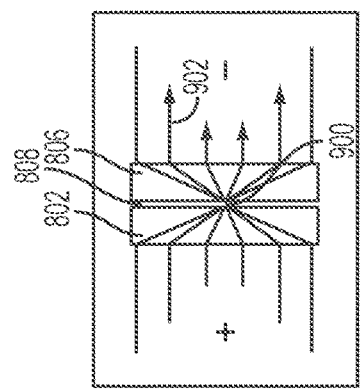

FIG. 9D depicts a developing contact MAKING state and/or contact CLOSED state in which the contact 106 has closed, at least temporarily, and the first and second electrical contacts 802, 806 are in physical contact, extinguishing the make spark.

Figure 9E:
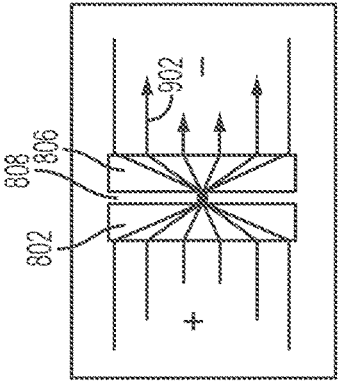

FIG. 9E depicts a developing contact MAKING state in which the contact 106 has bounced, creating a new gap 808 between the first and second electrical contacts 802, 806, thereby forming a current 902 constriction.

Figure 9F:
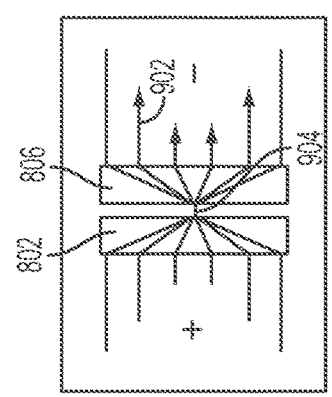

FIG. 9F depicts a developing contact MAKING state, in which a contact metal of the first and second electrical contacts 802, 806 has melted. Current 902 continues to flow through the contact 106

Figure 9G:
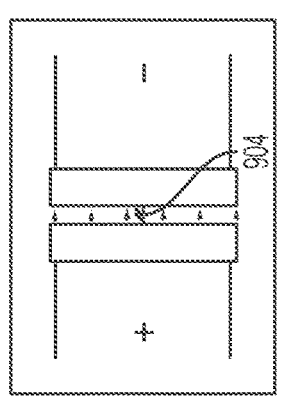

FIG. 9G depicts a developing contact MAKING state, in which molten metal from the first and second electrical contacts 802, 806 has formed a metal filament bridge 904, facilitating further current 902 flow.

Figure 9H:
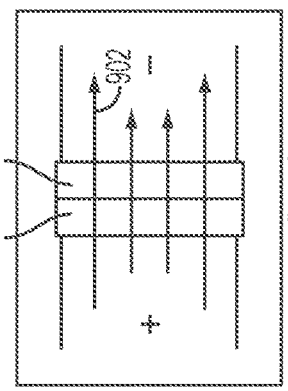

FIG. 9H depicts a developing contact MAKING state, in which the metal filament bridge 904 has ripped open, terminating flow of current over the contact 106. In various examples, the contact MAKING state may not register with the contact separation detector 200. However, in circumstances where an arc generated during the MAKING state does cross a threshold, the contact separation detector 200 may function as an arc detector generally, register the existence of an arc or arc condition, and trigger the arc suppressor 102 generally, as disclosed herein. However, in various circumstances, an arc generated during the MAKING state may not be of sufficient intensity to register with the contact separation detector 200.

Figure 9I:
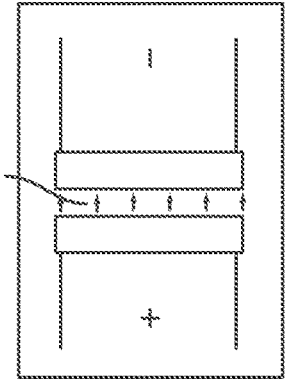

FIG. 9I depicts a developing contact MAKING state of a widening gap 808 preventing ongoing current flow.

Figure 9J:
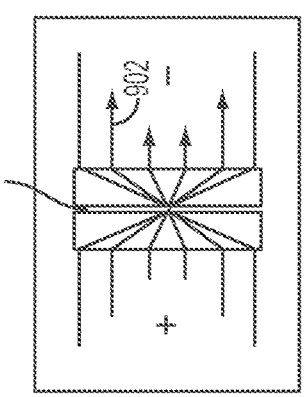

FIG. 9J depicts a developing contact MAKING state depicting the moment of a make spark 900 occurring the gap 808.

Figure 9K:
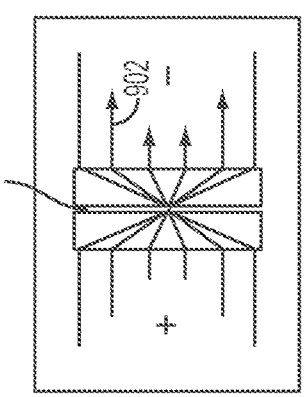

FIG. 9K depicts a developing contact MAKING state in which a make arc has ignited in the gap 808, permitting current 902 flow through the contact 106.

Figure 9L:
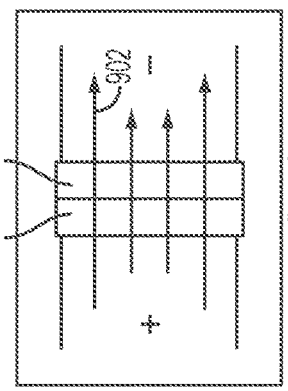

FIG. 9L depicts a contact CLOSED state, in which the first and second electrical contacts 802, 806 are in physical contact and current 902 flows over the contact 106.

The various states illustrated in FIGS. 9A-9L may produce reactions of the arc suppressor 102 as illustrated with respect to FIGS. 8A-8H, i.e., the detected current and/or voltage by the contact separation detector 200 may trigger the contact bypass circuit 206 and extinguish formed arcs. In various examples, each bounce may trigger the arc suppressor 102.

Signal Timing

Figure 10A:
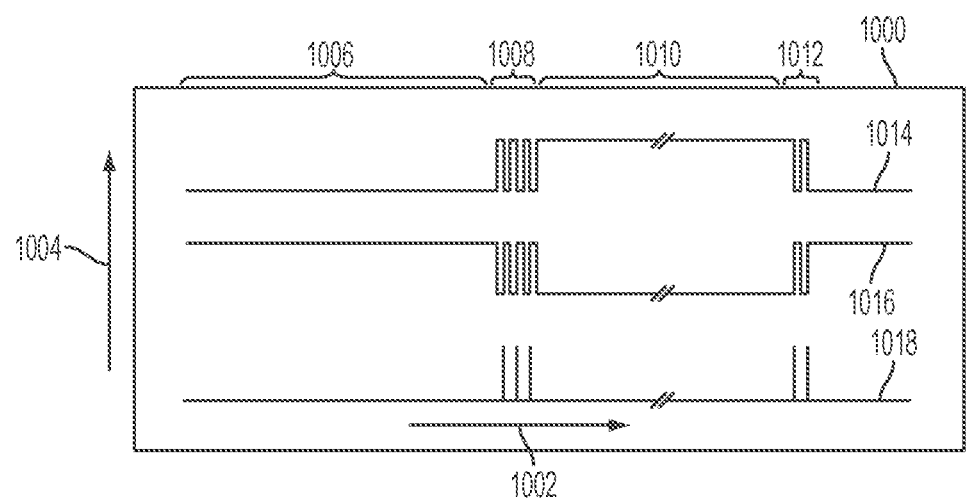
FIGS. 10A-10C depict waveform diagrams illustrating example embodiments of arc suppressor signal timing.
Figure 10B:
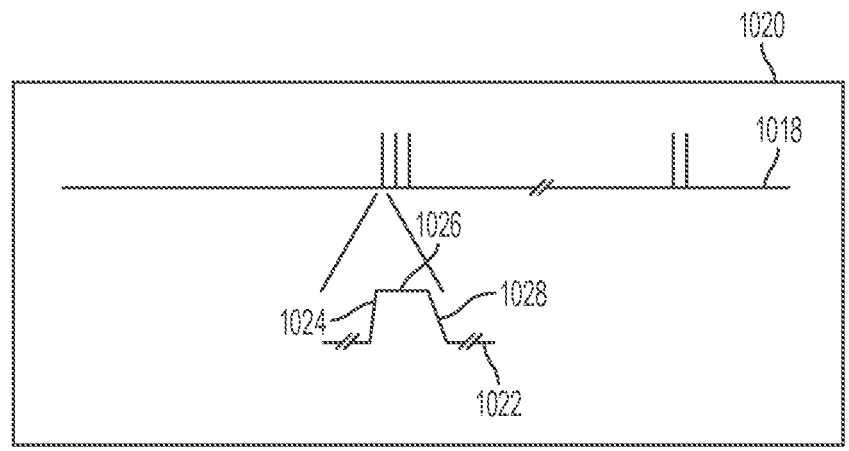
Figure 10C:
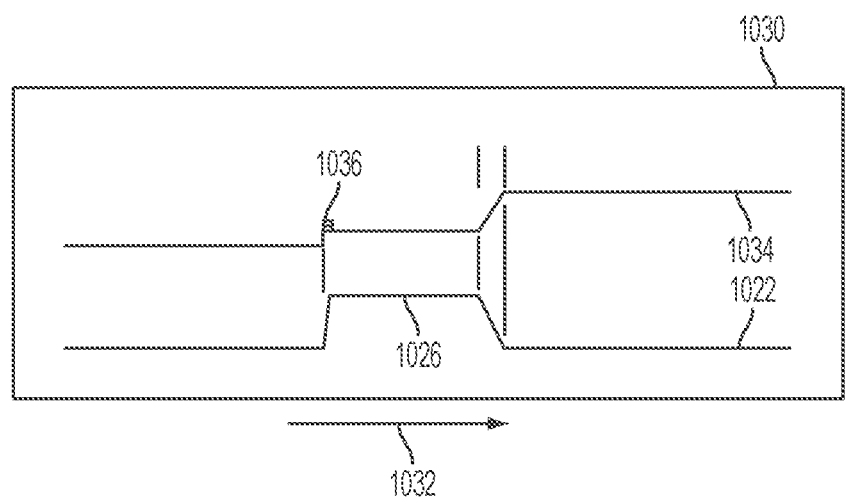

FIGS. 10A-10C depict waveform diagrams illustrating examples of arc suppressor signal timing. In various examples, the signals are as received by a contact bypass circuit, such as the contact bypass circuit 206, and may regulate the suppression of arcs within a contact, such as the contact 106.

FIG. 10A depicts timing diagram 1000 illustrating an example of a contact cycle of timing of a trigger signal to the contact bypass circuit 206 of the arc suppressor 106. The timing diagram includes a time axis 1002 and a variable amplitude axis 1004. The time axis 1002 includes sections corresponding to an open state 1006, a make state 1008, a closed state 1010, and a break state 1012. It is noted that the time axis 1002 has been interrupted during the closed state 1010.

A contact current waveform 1014 shows current through the contact 106. A contact voltage waveform 1016 shows a voltage over the contact 106. The trigger single waveform 1018 shows trigger signals as received by the contact bypass circuit 206.

In an example, in the break state 1012, the flow of current may be interrupted and the contact bypass circuit 206 receives bypass pulses coinciding with the rising edge of the contact voltage, indicating that the contact 106 is opening during the break state 1012. In turn, the load current may be re-routed through the arc suppressor 102, thus relieving or substantially relieving the contact 106 of current carrying duty and in doing so preventing or substantially preventing the contact 106 from arcing significantly, in effect suppressing the resulting contact arc.

FIG. 10B depicts a timing diagram 1020 illustrating an example of a single trigger signal pulse 1022 as receivable by the contact bypass circuit 206. The trigger signal pulse 1022 includes a fast rise time on the leading edge 1024 of the trigger signal pulse 1022 followed by a pulse duration 1026 at maximum voltage, followed by a slower rise time on the trailing edge 1028.

FIG. 10C depicts a timing diagram 1030 illustrating an example of an arc suppression voltage and current timing of the arc suppressor 102. The time axis 1032 has been magnified in comparison to the time axis 1002. The contact voltage waveform 1034 includes a relatively extremely fast risetime, in this example on the order of pico- to nanoseconds. In various examples, voltage slew rates may be of approximately eight (8) kiloVolts or greater. The contact separation detector 200 may be configured to detect such risetimes. In an example, within a few pico- to nanoseconds of the contact 106 breaking, the voltage across the contact 106 may reach the arc voltage which is between, for instance, nine (9) Volts and fifteen (15) Volts, depending on the specific contact material.

In this example, when the arc voltage is reached, the current through the contact 106 multiplied with the arc voltage may produce sufficient energy for a spark to ignite plasma in the contact gap 808 and develop into an arc. The arc may burn, for instance, for about five (5) microseconds before the arc suppressor 102 generates the trigger signal pulse for the contact bypass circuit 206 and subsequently extinguishes the arc by means of bypassing the contact current through the arc suppressor.

An arclet 1036 of, for instance, five (5) microseconds in duration may be the result of the arc suppression. Arc suppression duration can, in various examples, be around five hundred (500) microseconds in duration, such as in order to give the contact enough time to travel out of the ignition space. The trigger signal pulse 1022 may be risetime controlled at the transition to the open state, such as to reduce a likelihood of the arc suppressor 102 generating the trigger signal pulse based on a spurious signal. After the trigger signal pulse 1022 is over the contact gap 808 may still widen and the contact 106 may soon thereafter enter the open state.

Figure 11:
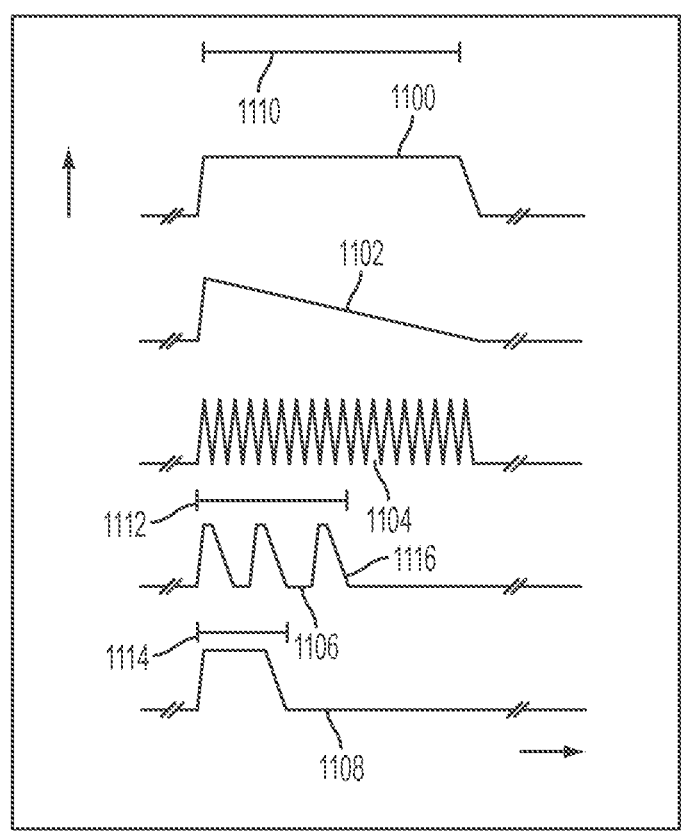
FIG. 11 depicts waveform diagrams illustrating example embodiments of arc suppressor operating modes.

FIG. 11 depicts waveform diagrams illustrating an example of arc suppressor operating modes. In various examples, there are five distinctly different two-port arc suppressor-operating modes, such as may be generated by the processor 204 as a trigger signal. Alternatively, various ones of the operating modes may be generated as the indication by the contact separation detector 200. The shape and type of trigger signal pulses may determine a specific operational nature of the arc suppressor 102.

In various examples, as illustrated in a first waveform 1100, in "crowbar" mode the current bypass circuit 206 receives a trigger pulse that triggers and holds for the remaining duration of a half cycle of an AC current through the contact 106. When the AC current waveform is near the current zero crossing, the arc may tend to extinguish, allowing the contact bypass circuit to be opened and current to flow through the contact 106.

In various examples, as illustrated in a second waveform 1102, in "linear" mode the current bypass circuit 206 receives a trigger pulse with a single bypass ramp starting at low resistance and passing through a linear region of an element, such as a BJT, FET. IBGT, and the like, of the current bypass circuit 206 long enough to extinguish a contact arc.

In various examples, as illustrated in a third waveform 1104, in "oscillating" mode the current bypass circuit 206 receives trigger pulses with a burst of low resistance sufficiently long enough to extinguish the contact arc.

In various examples, as illustrated in a fourth waveform 1106, in "multi-pulse" mode the current bypass circuit 206 receives a series of individual trigger pulses 1116, over a duration 1112, with low resistance sufficiently long enough to extinguish the contact arc.

In various examples, as illustrated in a fifth waveform 1108, in "single-pulse" mode the current bypass circuit 206 receives a trigger pulse, over a duration 1114, with a low resistance bypass pulse of sufficiently short duration to extinguish the contact arc.

In various examples, the waveforms 1100, 1102, 1104 may have a total duration 1110 that is equal or substantially equal to the duration 1026 of the arc condition as disclosed above with respect to FIG. 10. Thus, in the example of the waveforms 1104, each individual oscillation may occur over the cumulative duration 1104.

Arc Suppressor Examples

The arc suppressor 102 may be configured for any of a variety of applications and circumstances. In various examples, the arc suppressor 102 supports electric vehicle automobile battery voltages, such as an automobile battery voltage of approximately one thousand (1000) Volts DC. In various examples, the arc suppressor supports hybrid electric automobile battery voltages, such as a hybrid electric automobile battery voltage of approximately five hundred (500) Volts DC. In various examples, the arc suppressor supports various sizes and power capabilities to support a change from a current automobile vehicle standard battery voltage, such as a voltage of twelve (12) Volts DC, to a new automotive vehicle standard battery voltage, such as approximately forty-two (42) Volts DC. In various examples, the arc suppressor supports various sizes and power capabilities to support the electric vehicle automobile battery voltages, such as electric vehicle automobile battery voltages of up to and in excess of approximately one thousand (1000) Volts DC. In various examples, the arc suppressor supports various sizes and power capabilities to support hybrid electric automobile battery voltages, such as hybrid electric automobile battery voltages of up to approximately five hundred (500) Volts DC.

Externally Powered High Power Two-Port Arc Suppressor

Figure 12:
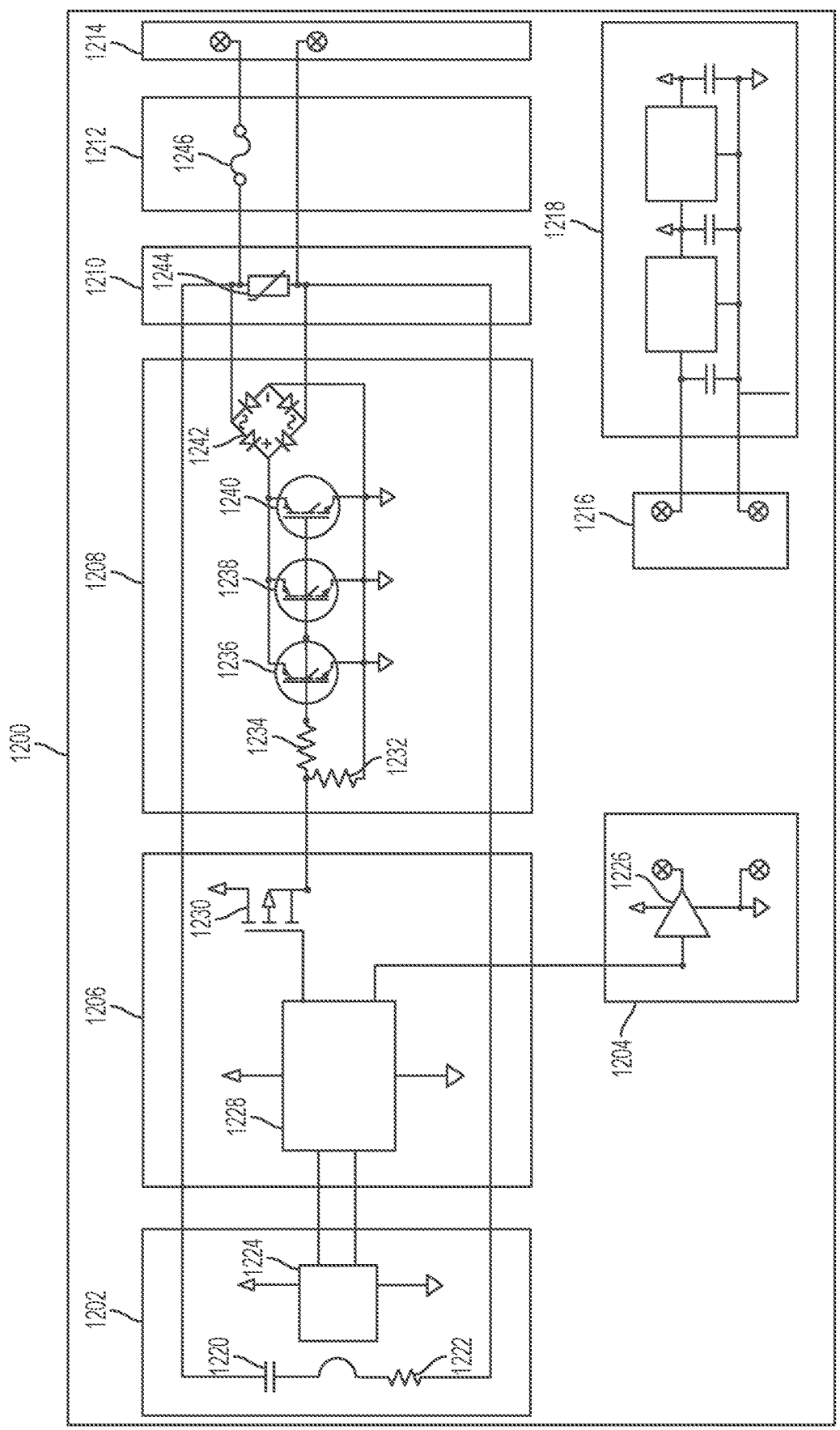
FIG. 12 depicts a schematic diagram illustrating an example embodiment of an externally powered, high power two-port arc suppressor.

FIG. 12 depicts a schematic diagram illustrating an example of an externally powered, high power two-port arc suppressor 1200. The arc suppressor 1200, as illustrated, includes a contact separation detector 1202, an indicator 1204, a processor 1206, a contact bypass circuit 1208, a component protection circuit 1210, a protection circuit 1212, a connection termination 1214, an optional power connection 1216, and a power supply 1218. It is to be recognized and understood that the components of these blocks 1202-1218 may be selected from any of a variety of blocks disclosed herein, such as in FIGS. 3A-3G, 4A-4E, 5A-5D, and 6A-6F. Additionally, the blocks 1202-1218 may be replaced with alternative components. While the discrete components disclosed with respect to the are suppressor 1200 are presented herein according to example values, it is to be understood that alternative value components may be utilized to provide alternative performance characteristics for the arc suppressor 1200.

In various examples, the arc suppressor 1200 includes the following components: a first capacitor 1220 having a capacitance of 0.1 microFarads; a first resistor 1222 having a resistance of one hundred (100) Ohms; a Hall-effect sensor 1224; a transmission line driver 1226; a system on a chip 1228, such as may operate at twenty-four (24) megahertz; a field effect transistor 1230 configured to be coupled across a fifteen (15) Volt supply: a second resistor 1232 of fifteen (15) kiloOhms; a third resistor 1234 of thirty-three kiloOhms; first, second, and third IGBTs 1236, 1238, 1240 having a collector-emitter breakdown voltage of one thousand seven hundred (1700) Volts, a current collector of two hundred (200) Amperes, and a maximum power of one thousand forty (1040) Watts: a bridge rectifier 1242; a varistor 1244 rated up to one thousand (1000) Volts; and a fuse 1246 of up to thirty (30) Amperes and one thousand (1000) Volts. In the illustrated example and with the component values listed, the arc suppressor 1200 may support a one (1) megaWatt contact 106 and applications of one thousand (1000) Volts DC across the contact 106 and one thousand (1000) Amperes through the contact 106.

Signal Powered AC Arc Suppressor

Figure 13:
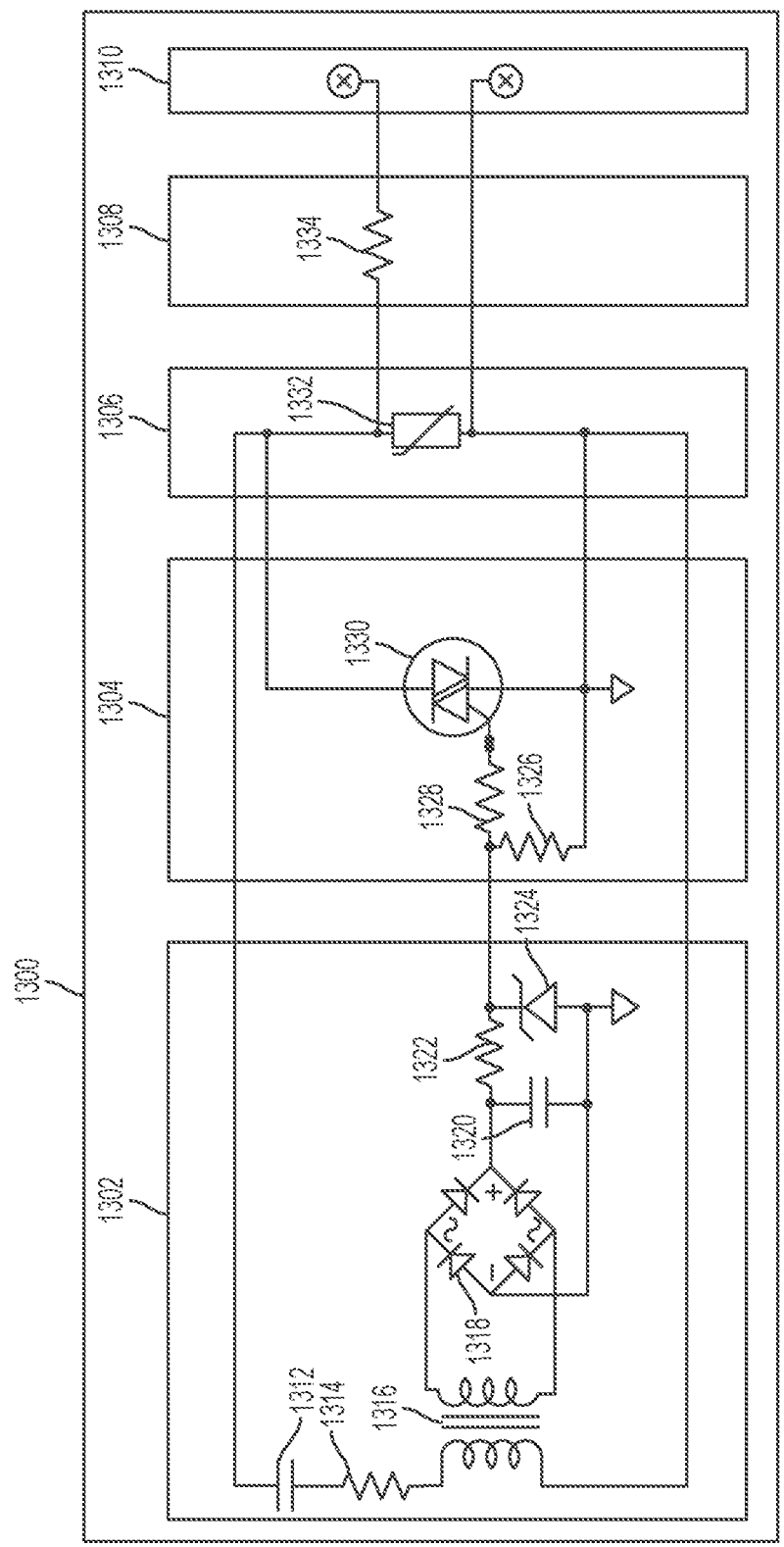
FIG. 13 depicts a schematic diagram illustrating an example embodiment of a signal powered AC arc suppressor.

FIG. 13 depicts a schematic diagram illustrating an example of a signal powered AC arc suppressor 1300. The arc suppressor 1300, as illustrated, includes a contact separation detector 1302, a contact bypass circuit 1304, a component protection circuit 1306, a protection circuit 1308, and a connection termination 1310. It is to be recognized and understood that the components of these blocks 1302-1310 may be selected from any of a variety of blocks disclosed herein, such as in FIGS. 3A-3G and 6A-6F. In an example, the contact separation detector 1302 may include a triac, as disclosed herein. Additionally, the blocks 1302-1310 may be replaced with various alternative components. While the discrete components disclosed with respect to the arc suppressor 1300 are presented herein according to example values, it is to be understood that alternative value components may be utilized to provide alternative performance characteristics for the arc suppressor 1300.

In various examples, the arc suppressor 1300 includes the following components: a first capacitor 1312 of 0.1 microFarads; a first resistor 1314 of ten (10) Ohms; a transformer 1316 with a ratio of 1:100; a bridge rectifier 1318; a second capacitor 1320 of 0.01 microFarads; a second resistor 1322 of one thousand (1000) Ohms; a Zener diode 1324 rated for twelve (12) Volts; a third resistor 1326 of fifteen (15) kiloOhms; a fourth resistor 1328 of one hundred (100) Ohms; a triac 1330 having a gate trigger voltage of 1.3 Volts and a holding current of fifty (50) milliAmperes: a varistor 1332 rated at three hundred (300) Volts AC; and, optionally, a zero Ohm resistor 1334. In one example illustrated here, the components of the signal powered AC arc suppressor 1300 may be scaled appropriately to be able to support an 27.7 kiloWatt contact and arc suppression application of two hundred seventy-seven Volt AC across the contact 106 and a one hundred (100) Ampere maximum circuit rating.

In an example, components of a signal powered timer controlled two-port are suppressor may be scaled appropriately to be able to support an 8 kW contact and arc suppression application of 200 Vac volts across the contact and 40 Amp max circuit rating through the contact two-port contact arc suppression capability. An example of a bill-of-material for this exemplary topologically configured and component scaled as per application specific requirements for this signal powered two-port arc suppressor is indicated below.

The above examples are non-limiting, and arc suppressors may be developed according to the principles and topologies disclosed herein to meet specifications across a range of applications. Arc suppressors as disclosed herein may be fabricated using a variety of technologies known in the art, including solid state, ceramic, and thick film technologies. A family of arc suppressor devices may be scaled from small size to large size, low power to high power, low voltage to high voltage, low current to high current.

It is to be understood that the arc suppressor examples disclosed herein may be carried out by different equipment and devices, and that various modifications, both as to the equipment and operating procedures, may be accomplished without departing from the scope of the arc suppressor itself.

The description of the various embodiments is merely exemplary in nature and, thus, variations that do not depart from the gist of the examples and detailed description herein are intended to be within the scope of the present disclosure. Such variations are not to be regarded as a departure from the spirit and scope of the present disclosure.

Flowchart

Figure 14:
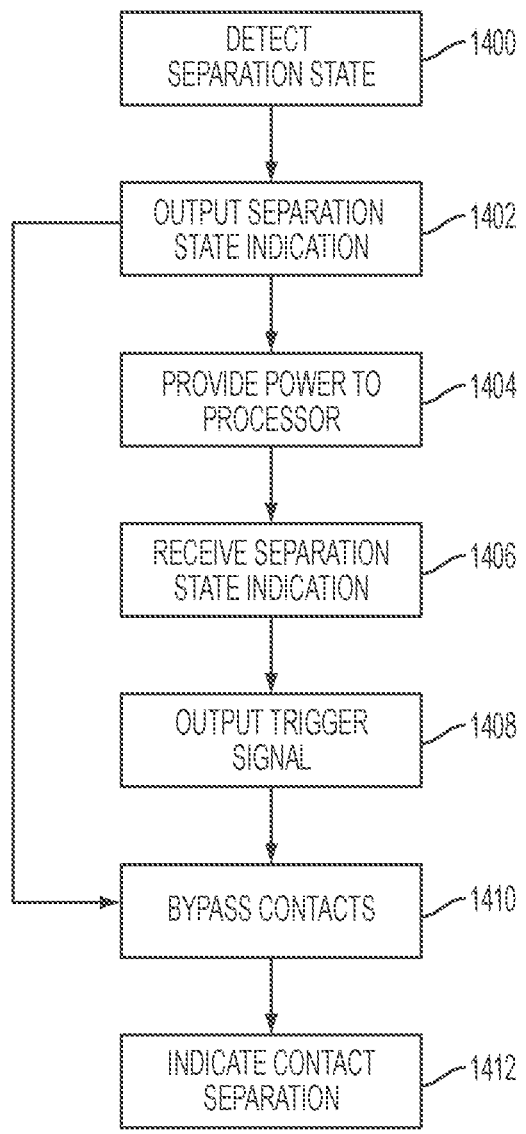
FIG. 14 is a flowchart for suppressing an arc, in an example embodiment.

FIG. 14 is a flowchart for suppressing an arc. The flowchart may be applicable to the arc suppressor 102 or to any other suitable circuit or system.

At 1400, a separation state of a pair of electrical contacts is detected with a contact separation detector. In an example, detecting further includes detecting at least one of a voltage change over the pair contacts and a current change through the pair of contacts. In an example, the contact bypass circuit includes a triac including a gate and a pair of terminals, each of the pair of terminals coupled to a different one of the pair of contacts, and wherein bypassing the pair of contacts includes, upon the gate receiving the indication, opening the triac to provide the electrical bypass. In an example, the electrical bypass includes at least one of a transistor and a rectifier.

At 1402, an indication of the separation state is output with the contact separation detector.

At 1404, power is optionally provided to the processor by a power supply.

At 1406, the indication is received by a processor.

At 1408, the a trigger signal is output by the processor based on the indication being indicative of at least one of a separation of the pair of electrical contacts and an arc condition. In an example, the trigger signal has a predetermined duration configured to allow a distance between the pair of contacts to exceed an arc ignition space. In an example, the predetermined duration is such that at least one of an amount of charge carriers between the pair of contacts is below a level at which an arc between the contacts is not maintained and an arc cannot be thermodynamically supported between the pair of contacts occurs.

At 1410, the pair of contacts is bypassed with a contact bypass circuit having an electrical bypass based on the indication. In an example, the pair of contacts is bypassed based on the trigger signal as generated based on the indication.

At 1412, an indication of an operation of the electrical circuit is indicated by an indicator. In an example, the indication of the operation of the electrical circuit is based on the operation output from the processor. In an example, the indication includes at least one of a visual indication, an audio indication, and an electronic data indication.

ADDITIONAL EXAMPLES

The description of the various embodiments is merely exemplary in nature and, thus, variations that do not depart from the gist of the examples and detailed description herein are intended to be within the scope of the present disclosure. Such variations are not to be regarded as a departure from the spirit and scope of the present disclosure.

In Example 1, an electrical circuit or system includes a contact separation detector configured to output an indication of a separation state of a pair of electrical contacts and a contact bypass circuit, coupled to the contact separation detector, configured to provide an electrical bypass between the pair of contacts based on the indication.

In Example 2, the electrical circuit of Example 1 optionally further includes that the contact separation detector is configured to detect at least one of a voltage change over the pair contacts and a current change through the pair of contacts.

In Example 3, the electrical circuit of any one or more of Examples 1 and 2 optionally further includes that the contact separation detector is configured to output the indication based on a rising edge of the voltage change.

In Example 4, the electrical circuit of any one or more of Examples 1-3 optionally further includes a processor, coupled to the contact separation detector, configured to receive the indication and output a trigger signal based on the indication being indicative of at least one of a separation of the pair of electrical contacts and an arc condition, and that the contact bypass circuit is configured to provide the electrical bypass based on the trigger signal.

In Example 5, the electrical circuit of any one or more of Examples 1-4 optionally further includes that the processor is configured to output the trigger signal such that the trigger signal has a predetermined duration configured to allow a distance between the pair of contacts to exceed an arc ignition space.

In Example 6, the electrical circuit of any one or more of Examples 1-5 optionally further includes that the predetermined duration is substantially between an end of a risetime of the trigger signal and a beginning of a falltime of the trigger signal.

In Example 7, the electrical circuit of any one or more of Examples 1-6 optionally further includes that the risetime of the trigger signal is less than the falltime of the trigger signal.

In Example 8, the electrical circuit of any one or more of Examples 1-7 optionally further includes that the arc ignition space comprises a distance at which a voltage over the pair of contacts is less than an arc voltage.

In Example 9, the electrical circuit of any one or more of Examples 1-8 optionally further includes that the predetermined duration is such that at least one of: an amount of charge carriers between the pair of contacts is below a level at which an arc between the contacts is not maintained; and an arc cannot be thermodynamically supported between the pair of contacts occurs.

In Example 10, the electrical circuit of any one or more of Examples 1-9 optionally further includes that the processor is configured to provide the trigger signal based on half of an AC cycle of a signal over the pair of contacts.

In Example 11, the electrical circuit of any one or more of Examples 1-10 optionally further includes that the processor is configured to provide the trigger signal at a voltage that starts at a first voltage and decreases to a second voltage, wherein the contact bypass circuit provides a diminishing shunt resistance as the voltage of the trigger signal decreases from the first voltage to the second voltage.

In Example 12, the electrical circuit of any one or more of Examples 1-11 optionally further includes that the processor is configured to provide the trigger signal as plurality of pluses over a predetermined duration, each of the pulses being configured to cause the contact bypass circuit to provide the shunt resistance at a low resistance during the predetermined duration.

In Example 13, the electrical circuit of any one or more of Examples 1-12 optionally further includes a power supply coupled to the processor and configured to provide power for operation of the processor.

In Example 14, the electrical circuit of any one or more of Examples 1-13 optionally further includes that the power supply includes at least one of a battery, an external power feed, a voltage regulator, and a power regulator.

In Example 15, the electrical circuit of any one or more of Examples 1-14 optionally further includes that the power supply comprises a first terminal coupleable to a first voltage source configured to provide a first voltage and a second terminal coupleable to a second voltage source configured to provide a second voltage different than the first voltage, and wherein the power source is configured to provide the power for operation based on each of the first voltage and the second voltage.

In Example 16, the electrical circuit of any one or more of Examples 1-15 optionally further includes that the voltage regulator comprises a first voltage regulator configured to supply power based on the first voltage and a second voltage regulator configured to supply power based on the second voltage.

In Example 17, the electrical circuit of any one or more of Examples 1-16 optionally further includes that the power regulator comprises a first power regulator configured to supply power based on the first voltage and a second power regulator configured to supply power based on the second voltage.

In Example 18, the electrical circuit of any one or more of Examples 1-17 optionally further includes that the contact bypass circuit comprises a triac including a gate and a pair of terminals, each of the pair of terminals coupled to a different one of the pair of contacts, wherein, upon the gate receiving the indication, the triac opens to provide the electrical bypass.

In Example 19, the electrical circuit of any one or more of Examples 1-18 optionally further includes that electrical bypass includes at least one of a transistor and a rectifier.

In Example 20, the electrical circuit of any one or more of Examples 1-19 optionally further includes that the transistor is at least one of a bipolar junction transistor, a field effect transistor, and an insulated-gate bipolar transistor.

In Example 21, the electrical circuit of any one or more of Examples 1-20 optionally further includes that the electrical bypass further includes a bridge rectifier, the at least one transistor and rectifier has an output terminal coupled to the bridge rectifier, wherein the bridge rectifier has a first terminal coupled to one of the pair of contacts and a second terminal coupled to another of the pair of contacts, and wherein a signal from the output terminal engages the bridge rectifier to open the electrical bypass.

In Example 22, the electrical circuit of any one or more of Examples 1-21 optionally further includes a component protection circuit coupled to the contact bypass circuit configured to protect, at least in part, at least one of the contact separation detector, and the contact bypass circuit against a voltage surge.

In Example 23, the electrical circuit of any one or more of Examples 1-22 optionally further includes that the component protection circuit includes at least one of a metal oxide varistor, a transient voltage suppressor, and a zener diode.

In Example 24, the electrical circuit of any one or more of Examples 1-23 optionally further includes that the component protection circuit comprises a pair of zener diodes back-to-back, wherein a cathode of each of the zener diodes is coupled to a respective one of the pair contacts.

In Example 25, the electrical circuit of any one or more of Examples 1-24 optionally further includes a protection circuit coupled between one of the pair of contacts and the contact separation detector, wherein the protection circuit is configured to protect, at least in part, the contact separation detector against a voltage surge.

In Example 26, the electrical circuit of any one or more of Examples 1-25 optionally further includes that the protection circuit comprises at least one of a fuse, a resistor, a circuit breaker, and a fusible link in series between the one of the pair of contacts and the contact separation detector.

In Example 27, the electrical circuit of any one or more of Examples 1-26 optionally further includes an indicator configured to provide an indication of an operation of the electrical circuit.

In Example 28, the electrical circuit of any one or more of Examples 1-26 optionally further includes a processor, coupled to the contact separation detector, configured to receive the indication and output a trigger signal based on the indication being indicative of at least one of a separation of the pair of electrical contacts and an arc condition, and that the indicator is coupled to the processor, wherein the processor generates an operation output, and wherein the indicator is configured to provide the indication of the operation of the electrical circuit based on the operation output from the processor.

In Example 29, the electrical circuit of any one or more of Examples 1-28 optionally further includes that the processor comprises a first output line configured to provide the trigger signal and a second output line configured to provide the operation output, wherein the first output line is coupled to the contact bypass circuit and the second output line is coupled to the indicator.

In Example 30, the electrical circuit of any one or more of Examples 1-29 optionally further includes that the indication is at least one of: an assumed arc between the pair of contacts; a connection failure; a failure code; a number of events related to the separation state of the pair of contacts as detected by the contact separation detector; a rate of events related to the separation state of the pair of contacts as detected by the contact separation detector; a time of separation of the pair of contacts; the processor outputting the trigger signal.

In Example 31, the electrical circuit of any one or more of Examples 1-30 optionally further includes that the indicator is coupleable to an external device and wherein the indicator is configured to provide the indication to the external device.

In Example 32, the electrical circuit of any one or more of Examples 1-31 optionally further includes that the indicator is configured to provide at least one of a visual indication, an audio indication, and an electronic data indication.

In Example 33, the electrical circuit of any one or more of Examples 1-32 optionally further includes that the indicator comprises at least one of: a light emitting diode configured to provide the visual indication; a speaker configured to provide the audio indication; a piezo-electric transducer configured to provide the audio indication; and a transmission line driver configured to provide the electronic data indication.

In Example 34, a method includes detecting, with a contact separation detector, a separation state of a pair of electrical contacts, outputting, with the contact separation detector, an indication of the separation state, and bypassing, with a contact bypass circuit having an electrical bypass between the pair of contacts based on the indication.

In Example 35, the method of Example 34 optionally further includes that detecting further includes detecting at least one of a voltage change over the pair contacts and a current change through the pair of contacts.

In Example 36, the method of any one or more of Examples 34 and 35 optionally further includes that outputting further includes outputting the indication based on a rising edge of the voltage change.

In Example 37, the method of any one or more of Examples 34-36 optionally further includes receiving, with a processor, the indication and outputting a trigger signal based on the indication being indicative of at least one of a separation of the pair of electrical contacts and an arc condition, and providing the electrical bypass is based on the trigger signal.

In Example 38, the method of any one or more of Examples 34-37 optionally further includes that outputting the trigger signal is such that the trigger signal has a predetermined duration configured to allow a distance between the pair of contacts to exceed an arc ignition space.

In Example 39, the method of any one or more of Examples 34-38 optionally further includes that the predetermined duration is substantially between an end of a risetime of the trigger signal and a beginning of a falltime of the trigger signal.

In Example 40, the method of any one or more of Examples 34-39 optionally further includes that the risetime of the trigger signal is less than the falltime of the trigger signal.

In Example 41, the method of any one or more of Examples 34-40 optionally further includes that the arc ignition space comprises a distance at which a voltage over the pair of contacts is less than an arc voltage.

In Example 42, the method of any one or more of Examples 34-41 optionally further includes that the predetermined duration is such that at least one of: an amount of charge carriers between the pair of contacts is below a level at which an arc between the contacts is not maintained; and an arc cannot be thermodynamically supported between the pair of contacts occurs.

In Example 43, the method of any one or more of Examples 34-42 optionally further includes that outputting the trigger signal is based on half of an AC cycle of a signal over the pair of contacts.

In Example 44, the method of any one or more of Examples 34-43 optionally further includes that outputting the trigger signal is at a voltage that starts at a first voltage and decreases to a second voltage, wherein bypassing the pair of contacts includes a diminishing shunt resistance as the voltage of the trigger signal decreases from the first voltage to the second voltage.

In Example 45, the method of any one or more of Examples 34-44 optionally further includes that outputting the trigger signal includes plurality of pluses over a predetermined duration, each of the pulses being configured to cause the contact bypass circuit to provide the shunt resistance at a low resistance during the predetermined duration.

In Example 46, the method of any one or more of Examples 34-45 optionally further includes providing, with a power supply, power for operation of the processor.

In Example 47, the method of any one or more of Examples 34-46 optionally further includes that the power supply includes at least one of a battery, an external power feed, a voltage regulator, and a power regulator.

In Example 48, the method of any one or more of Examples 34-47 optionally further includes that providing the power includes providing at first voltage at a first terminal and providing a second voltage different than the first voltage at a second terminal.

In Example 49, the method of any one or more of Examples 34-48 optionally further includes that the regulator includes a first regulator and a second regulator, and further comprises supplying, with the first voltage regulator, power based on the first voltage and supplying, with the second voltage regulator, a second voltage regulator configured to supply power based on the second voltage.

In Example 50, the method of any one or more of Examples 34-49 optionally further includes that the power regulator includes a first power regulator and a second power regulator, and further comprising supplying, with the first power regulator, power based on the first voltage and supplying, with the second power regulator power based on the second voltage.

In Example 51, the method of any one or more of Examples 34-50 optionally further includes that the contact bypass circuit comprises a triac including a gate and a pair of terminals, each of the pair of terminals coupled to a different one of the pair of contacts, and wherein bypassing the pair of contacts includes, upon the gate receiving the indication, opening the triac to provide the electrical bypass.

In Example 52, the method of any one or more of Examples 34-51 optionally further includes that the electrical bypass includes at least one of a transistor and a rectifier.

In Example 53, the method of any one or more of Examples 34-52 optionally further includes that the transistor is at least one of a bipolar junction transistor, a field effect transistor, and an insulated-gate bipolar transistor.

In Example 54, the method of any one or more of Examples 34-53 optionally further includes that the electrical bypass further includes a bridge rectifier, the at least one transistor and rectifier has an output terminal coupled to the bridge rectifier, wherein the bridge rectifier has a first terminal coupled to one of the pair of contacts and a second terminal coupled to another of the pair of contacts, and wherein a signal from the output terminal engages the bridge rectifier to open the electrical bypass.

In Example 55, the method of any one or more of Examples 34-54 optionally further includes protecting, with a component protection circuit, at least one of the contact separation detector, and the contact bypass circuit against a voltage surge.

In Example 56, the method of any one or more of Examples 34-55 optionally further includes that the component protection circuit includes at least one of a metal oxide varistor, a transient voltage suppressor, and a zener diode.

In Example 57, the method of any one or more of Examples 34-56 optionally further includes that the component protection circuit comprises a pair of zener diodes back-to-back, wherein a cathode of each of the zener diodes is coupled to a respective one of the pair contacts.

In Example 58, the method of any one or more of Examples 34-57 optionally further includes protecting, with a protection circuit, the contact separation detector against a voltage surge.

In Example 59, the method of any one or more of Examples 34-58 optionally further includes that the protection circuit comprises at least one of a fuse, a resistor, a circuit breaker, and a fusible link in series between the one of the pair of contacts and the contact separation detector.

In Example 60, the method of any one or more of Examples 34-59 optionally further includes indicating, with an indicator, an indication of an operation of the electrical circuit.

In Example 61, the method of any one or more of Examples 34-60 optionally further includes receiving, with a processor, the indication, outputting, with the processor, a trigger signal based on the indication being indicative of at least one of a separation of the pair of electrical contacts and an arc condition, and outputting, with the processor an operation output. Providing the indication of the operation of the electrical circuit is based on the operation output from the processor.

In Example 62, the method of any one or more of Examples 34-61 optionally further includes that the processor comprises a first output line configured to provide the trigger signal and a second output line configured to provide the operation output, wherein the first output line is coupled to the contact bypass circuit and the second output line is coupled to the indicator.

In Example 63, the method of any one or more of Examples 34-62 optionally further includes that the indication is at least one of: an assumed arc between the pair of contacts; a connection failure; a failure code; a number of events related to the separation state of the pair of contacts as detected by the contact separation detector; a rate of events related to the separation state of the pair of contacts as detected by the contact separation detector; a time of separation of the pair of contacts; the processor outputting the trigger signal.

In Example 64, the method of any one or more of Examples 34-63 optionally further includes that the indicator is coupleable to an external device and wherein the indicator is configured to provide the indication to the external device.

In Example 65, the method of any one or more of Examples 34-64 optionally further includes providing the indication includes providing at least one of a visual indication, an audio indication, and an electronic data indication.

In Example 66, the method of any one or more of Examples 34-65 optionally further includes that the indicator comprises at least one of: a light emitting diode configured to provide the visual indication: a speaker configured to provide the audio indication; a piezo-electric transducer configured to provide the audio indication; and a transmission line driver configured to provide the electronic data indication.

In Example 67, a system includes an electrical contact including a pair of contacts configured to couple a power source to a load and an arc suppressor, coupled to the electrical contact. The arc suppressor includes a contact separation detector configured to output an indication of a separation state of the pair of electrical contacts and a contact bypass circuit, coupled to the contact separation detector, configured to provide an electrical bypass between the pair of contacts based on the indication as provided by the contact separation detector.

In Example 68, the system of Example 67 optionally further includes a case configured to enclose the electrical contact and the arc suppressor.

In Example 69, the system of any one or more of Examples 67 and 68 optionally further includes that the electrical contact is a relay and wherein the case is a relay case.

In Example 70, the system of any one or more of Examples 67-69 optionally further includes the power source and the load.

In Example 71, the system of any one or more of Examples 67-70 optionally further includes that the power source is an automotive battery and wherein the arc suppressor is configured to prevent arcing over the pair of contacts at an automotive battery voltage.

In Example 72, the system of any one or more of Examples 67-71 optionally further includes that the load comprises an electric drivetrain.

In Example 73, the system of any one or more of Examples 67-72 optionally further includes a return connection between the power source and the load.

In Example 74, the system of any one or more of Examples 67-73 optionally further includes a switch, wherein the electrical contact is a component of the switch.

In Example 75, the system of any one or more of Examples 67-74 optionally further includes a connector, wherein the electrical contact is a component of the connector.

In Example 76, the system of any one or more of Examples 67-75 optionally further includes that the electrical contact is an electrode.

In Example 77, a method includes coupling an electrical contact to a contact separation detector of an arc suppressor, the electrical contact including a pair of contacts configured to couple a power source to a load, the contact separation detector configured to output an indication of a separation state of the pair of electrical contacts and coupling a contact bypass circuit of the arc suppressor to the contact separation detector, wherein the contact bypass circuit is configured to provide an electrical bypass between the pair of contacts based on the indication as provided by the contact separation detector.

In Example 78, the method of Example 77 optionally further includes enclosing the electrical contact and the arc suppressor in a case.

In Example 79, the method of any one or more of Examples 77 and 78 optionally further includes that the electrical contact is a relay and wherein the case is a relay case.

In Example 80, the method of any one or more of Examples 77-79 optionally further includes coupling the power source and the load to the electrical contact.

In Example 81, the method of any one or more of Examples 77-80 optionally further includes that the power source is an automotive battery and wherein the arc suppressor is configured to prevent arcing over the pair of contacts at an automotive battery voltage.

In Example 82, the method of any one or more of Examples 77-81 optionally further includes that the load comprises an electric drivetrain.

In Example 83, the method of any one or more of Examples 77-82 optionally further includes coupling a return connection between the power source and the load.

In Example 84, the method of any one or more of Examples 77-83 optionally further includes coupling a switch to the arc suppressor, wherein the electrical contact is a component of the switch.

In Example 85, the method of any one or more of Examples 77-84 optionally further includes coupling a connector to the arc suppressor, wherein the electrical contact is a component of the connector.

In Example 86, the method of any one or more of Examples 77-85 optionally further includes that the electrical contact is an electrode.

In Example 87, an electrical circuit or system of any one or more of Examples 1-33 optionally further includes a processor, including an input terminal and an output terminal, configured to output a plurality of pulses on the output terminal based on an indication at the input terminal of a separation of a pair of electrical contacts and a contact bypass circuit, coupled to the output terminal and in parallel with the pair of electrical contacts, configured to provide an electrical bypass between the pair of electrical contacts based on the plurality of pulses as generated by the processor.

In Example 88, the electrical circuit of any one or more of Examples 1-33 and 87 optionally further includes that the plurality of pulses is output for each indication received by the processor.

In Example 89, the electrical circuit of any one or more of Examples 1-33, 87 and 88 optionally further includes that the bypass circuit is configured to provide the electrical bypass a number of times corresponding to a number of pulses of the plurality of pulses.

In Example 90, the electrical circuit of any one or more of Examples 1-33 and 87-89 optionally further includes that the processor is configured to output the plurality of pulses according to a predetermined cumulative duration.

In Example 91, the electrical circuit of any one or more of Examples 1-33 and 87-90 optionally further includes that an arc duration is based on at least one of an amount of charge carriers between the pair of contacts being greater than a level at which an arc between the contacts is maintained and an arc being thermodynamically supported between the pair of contacts, and that the predetermined cumulative duration of the plurality of pulses is less than the arc duration.

In Example 92, the electrical circuit of any one or more of Examples 1-33 and 87-91 optionally further includes that the predetermined cumulative duration is based on a duration between a rising edge of a first one of the plurality of pulses and a falling edge of a last one of the plurality of pulses.

In Example 93, the electrical circuit of any one or more of Examples 1-33 and 87-92 optionally further includes that a duty cycle of the plurality of pulses varies during the predetermined cumulative duration.

In Example 94, the electrical circuit of any one or more of Examples 1-33 and 87-93 optionally further includes that the processor is configured to output the plurality of pulses according to a predetermined number of pulses.

In Example 95, the electrical circuit of any one or more of Examples 1-33 and 87-94 optionally further includes that each one of the plurality of pulses has a substantially equal pulse duration from a rising edge to a falling each of each one of the plurality of pulses.

In Example 96, the electrical circuit of any one or more of Examples 1-33 and 87-95 optionally further includes that the processor is at least one of an analog timer, a digital time, a microcontroller, and a system on a chip.

In Example 97, a method includes outputting, with a processor including an input terminal and an output terminal, a plurality of pulses on the output terminal based on an indication at the input terminal of a separation of a pair of electrical contacts and providing, with a contact bypass circuit in parallel with the pair of electrical contacts, an electrical bypass between the pair of electrical contacts based on the plurality of pulses as generated by the processor.

In Example 98, the method of Example 97 optionally further includes that outputting the plurality of pulses includes outputting the plurality of pulses for each indication received by the processor.

In Example 99, the method of any one or more of Examples 97 and 98 optionally further includes that providing the electrical bypass includes providing the electrical bypass a number of times corresponding to a number of pulses of the plurality of pulses.

In Example 100, the method of any one or more of Examples 97-99 optionally further includes that outputting the plurality of pulses includes outputting the plurality of pulses according to a predetermined cumulative duration.

In Example 101, the method of any one or more of Examples 97-100 optionally further includes that an arc duration is based on at least one of an amount of charge carriers between the pair of contacts being greater than a level at which an arc between the contacts is maintained and an arc being thermodynamically supported between the pair of contacts, and that the predetermined cumulative duration of the plurality of pulses is less than the arc duration.

In Example 102, the method of any one or more of Examples 97-101 optionally further includes that the predetermined cumulative duration is based on a duration between a rising edge of a first one of the plurality of pulses and a falling edge of a last one of the plurality of pulses.

In Example 103, the method of any one or more of Examples 97-102 optionally further includes that a duty cycle of the plurality of pulses varies during the predetermined cumulative duration.

In Example 104, the method of any one or more of Examples 97-103 optionally further includes that outputting the plurality of pulses includes outputting a predetermined number of pulses.

In Example 105, the method of any one or more of Examples 97-104 optionally further includes that each one of the plurality of pulses has a substantially equal pulse duration from a rising edge to a falling each of each one of the plurality of pulses.

In Example 106, the method of any one or more of Examples 97-105 optionally further includes that the processor is at least one of an analog timer, a digital time, a microcontroller, and a system on a chip.

The above detailed description includes references to the accompanying drawings, which form a part of the detailed description. The drawings show, by way of illustration, specific embodiments. These embodiments are also referred to herein as "examples." Such examples may include elements in addition to those shown and described. However, the present inventor also contemplates examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first." "second," and "third." etc. are used merely as labels, and are not intended to impose numerical requirements on their objects.

The above description is intended to be, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. In addition, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

The invention claimed is:

1. A system, comprising:
an electrical contact including a pair of contacts configured to couple a power source to a load, at least one of the pair of contacts including a contact surface on which oxidation may form; and
an arc suppressor, coupled to the electrical contact, comprising:
a contact separation detector configured to output an indication of a formation of an arclet between the pair of electrical contacts; and
a contact bypass circuit, coupled to the contact separation detector, configured to provide an electrical bypass between the pair of contacts based on the indication as provided by the contact separation detector, wherein the contact bypass circuit is configured to remove the oxidation from the contact surface by providing the electrical bypass before an arc forms across the pair of contacts in place of the arclet.

2. The system of claim 1, further comprising a case configured to enclose the electrical contact and the arc suppressor.

3. The system of claim 2, wherein the electrical contact is a relay and wherein the case is a relay case.

4. The system of claim 1, further comprising the power source and the load.

5. The system of claim 4, wherein the power source is an automotive battery and wherein the arc suppressor is configured to prevent arcing over the pair of contacts at an automotive battery voltage.

6. The system of claim 5, wherein the load comprises an electric drivetrain.

7. The system of claim 4, further comprising a return connection between the power source and the load.

8. The system of claim 1, wherein the contact bypass circuit is configured to provide the electrical bypass five (5) microseconds after formation of the arclet.

9. The system of claim 1, further comprising a processor, coupled to the contact separation detector and to the contact bypass circuit, the processor configured to receive the indication and output a trigger signal to the contact bypass circuit based on the indication being indicative of the arclet, the processor configured to output the trigger signal timed to provide the electrical bypass before the arc forms across the pair of contacts in place of the arclet.

10. The system of claim 9, wherein the processor is configured to output the trigger signal based on a passage of five (5) microseconds after the contact separation detector detects the arclet.

11. A method, comprising:
coupling an electrical contact to a contact separation detector of an arc suppressor, the electrical contact including a pair of contacts configured to couple a power source to a load, at least one of the pair of contacts including a contact surface on which oxidation may form, the contact separation detector configured to output an indication of a formation of an arclet between the pair of electrical contacts; and
coupling a contact bypass circuit of the arc suppressor to the contact separation detector, wherein the contact bypass circuit is configured to provide an electrical bypass between the pair of contacts based on the indication as provided by the contact separation detector, wherein the contact bypass circuit is configured to remove oxidation from the contact surface by providing the electrical bypass before an arc forms across the pair of contacts in place of the arclet.

12. The method of claim 11, further comprising enclosing the electrical contact and the arc suppressor in a case.

13. The method of claim 12, wherein the electrical contact is a relay and wherein the case is a relay case.

14. The method of claim 11, further comprising coupling the power source and the load to the electrical contact.

15. The method of claim 14, wherein the power source is an automotive battery and wherein the arc suppressor is configured to prevent arcing over the pair of contacts at an automotive battery voltage.

16. The method of claim 15, wherein the load comprises an electric drivetrain.

17. The method of claim 14, further comprising coupling a return connection between the power source and the load.

18. The method of claim 11, wherein the contact bypass circuit is configured to provide the electrical bypass five (5) microseconds after formation of the arclet.

19. The method of claim 11, further comprising coupling a processor to the contact separation detector and to the contact bypass circuit, the processor configured to receive the indication and output a trigger signal to the contact bypass circuit based on the indication being indicative of the arclet, the processor configured to output the trigger signal timed to provide the electrical bypass before the arc forms across the pair of contacts in place of the arclet.

20. The method of claim 19, wherein the processor is configured to output the trigger signal based on a passage of five (5) microseconds after the contact separation detector detects the arclet.

* * * * *